US008723306B2

(12) United States Patent
Tsuyuno et al.

(10) Patent No.: US 8,723,306 B2
(45) Date of Patent: May 13, 2014

(54) POWER SEMICONDUCTOR UNIT, POWER MODULE, POWER SEMICONDUCTOR UNIT MANUFACTURING METHOD, AND POWER MODULE MANUFACTURING METHOD

(75) Inventors: Nobutake Tsuyuno, Naka-gun Tokai (JP); Hiroshi Hozoji, Hitachiota (JP); Toshiaki Ishii, Hitachi (JP); Tokihito Suwa, Hitachinaka (JP); Kinya Nakatsu, Hitachinaka (JP); Takeshi Tokuyama, Hitachi (JP); Junpei Kusukawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/811,722

(22) PCT Filed: Jul. 25, 2011

(86) PCT No.: PCT/JP2011/066854
§ 371 (c)(1),
(2), (4) Date: Jan. 23, 2013

(87) PCT Pub. No.: WO2012/014843
PCT Pub. Date: Feb. 2, 2012

(65) Prior Publication Data
US 2013/0119525 A1 May 16, 2013

(30) Foreign Application Priority Data
Jul. 26, 2010 (JP) .................................. 2010-166705

(51) Int. Cl.
*H01L 23/495* (2006.01)
(52) U.S. Cl.
USPC ............ 257/692; 257/670; 257/675; 257/676

(58) Field of Classification Search
USPC .................................. 257/670, 675, 676, 692
See application file for complete search history.

(56) References Cited

U.S. PATENT DOCUMENTS 5,672,910 A     9/1997   Majumdar et al.
5,821,610 A * 10/1998   Nishikawa .................... 257/670
(Continued)

FOREIGN PATENT DOCUMENTS

JP           9-153574 A      6/1997
JP     2004-303869 A    10/2004
(Continued)

OTHER PUBLICATIONS

Corresponding International Search Report with English Translation dated Oct. 25, 2011 (four (4) pages).

*Primary Examiner* — Thanh V Pham
(74) *Attorney, Agent, or Firm* — Crowell & Moring LLP

(57) ABSTRACT

Heat radiation surfaces 7b and 8b of electrode lead frames 7 and 8 make thermal contact with heat radiation members 301 via insulation sheets 10 to dissipate heat from a power semiconductor element 5 to the heat radiation members (thick portions 301). Each of exposed areas of the heat radiation surfaces 7b and 8b and a surface 13b of a mold material (sealing material 13) adjacent to the exposed area produce an uneven step from which either one of the exposed area and the surface 13b adjacent to the exposed area projects. The step side surface formed between the convex surface and the concave surface of the uneven step has an inclined surface 7a or 13a so configured that an obtuse angle can be formed by the inclined surface and the convex surface and by the inclined surface and the concave surface for each.

14 Claims, 25 Drawing Sheets

ENLARGED D1
(a)

ENLARGED D2
(b)

(56) References Cited

U.S. PATENT DOCUMENTS

| | | | |
|---|---|---|---|
| 6,703,703 B2 * | 3/2004 | Grant | 257/688 |
| 8,318,287 B1 * | 11/2012 | Glenn | 428/123 |
| 2009/0215230 A1 | 8/2009 | Muto et al. | |
| 2010/0258925 A1 * | 10/2010 | Jeon et al. | 257/676 |
| 2011/0074007 A1 * | 3/2011 | Lopez et al. | 257/692 |

FOREIGN PATENT DOCUMENTS

| | | |
|---|---|---|
| JP | 2009-200338 A | 9/2009 |
| JP | 2011-91259 A | 5/2011 |
| JP | 2011-129818 A | 6/2011 |

* cited by examiner

ENLARGED D1
(a)

ENLARGED D2
(b)

(a)

(b)

POWER SEMICONDUCTOR UNIT, POWER MODULE, POWER SEMICONDUCTOR UNIT MANUFACTURING METHOD, AND POWER MODULE MANUFACTURING METHOD

TECHNICAL FIELD

The present invention relates to a power semiconductor unit included in a power converter mounted on a vehicle or others, a power module including this power semiconductor unit, a power semiconductor unit manufacturing method, and a power module manufacturing method.

BACKGROUND ART

Recently, development of a low fuel cost type automobiles has been demanded for promoting energy savings, and therefore an electric automobile driven by a motor, and a hybrid automobile running by a combination of motor driving and engine driving have been attracting attention. According to these types of vehicles, a large-capacity motor mounted thereon is difficult to drive and control by direct current voltage supplied from a battery, wherefore a power converter operable by switching of power semiconductors is an essential device for achieving voltage boosting and alternating current control. Moreover, it is important that the power semiconductors which generate heat when energized have a cooling structure for cooling the power semiconductors.

According to a semiconductor device disclosed in PTL 1, a pair of heat sink electrodes are provided in such positions that a semiconductor element is sandwiched between the heat sink electrodes, and the heat sink electrodes thus positioned are sealed by mold resin. The semiconductor element can be efficiently cooled when the heat sinks functioning as electrodes as well are attached to a cooling surface of a cooling unit, for example. According to this structure, an insulation sheet having high heat conductivity or the like is disposed between the cooling surface and each of the heat sink electrodes so as to secure electric insulation.

CITATION LIST

Patent Literature

PTL 1: JP-A-2004-303869

SUMMARY OF INVENTION

Technical Problem

When steps are produced between the heat radiation surfaces of the heat sink electrodes and the mold resin during molding by using the mold resin, voids (small cavities) easily develop in the positions of the steps at the time of close bonding between the insulation sheets and the heat radiation surfaces. These voids decrease the heat radiation performance. Moreover, under the use environment of the maximum voltage exceeding 300V, partial discharge easily occurs due to the existence of the voids.

Solution to Problem

A first mode of the invention is directed to a power semiconductor unit which includes: a power semiconductor element; an electrode lead frame formed by a plate-shaped conductive member, one of the front and rear surfaces of the plate-shaped conductive member having a junction surface to which an electrode surface of the power semiconductor element is metal-joined, and the other of the front and rear surfaces of the plate-shaped conductive member having a heat radiation surface; and a mold material which forms the power semiconductor element by molding in such a manner that at least a part of the heat radiation surface is exposed. The heat radiation surface makes thermal contact with a heat radiation member via an insulation sheet to dissipate heat from the power semiconductor element to the heat radiation member. An exposed area of the heat radiation surface and the surface of the mold material adjacent to the exposed area produce an uneven step from which either one of the exposed area and the surface of the mold material adjacent to the exposed area projects. The step side surface formed between the convex surface and the concave surface of the uneven step has an inclined surface so configured that an obtuse angle can be formed by the inclined surface and the convex surface and by the inclined surface and the concave surface for each.

According to a second mode of the invention, it is preferable that the uneven step is an area where a part of the heat radiation surface is recessed from the surface of the mold material in the power semiconductor unit according to the first mode. In this case, the inclined surface has an inclined processed surface formed at the edge of the mold material projecting in such a manner as to surround the heat radiation surface.

According to a third mode of the invention, it is preferable that the uneven step is an area where the whole of the heat radiation surface projects from the surface of the mold material in the power semiconductor unit in the first mode. In this case, the inclined surface has a chamfered surface formed at the edge of the heat radiation surface projecting from the surface of the mold material.

According to a fourth mode of the invention, it is preferable that the angle of the inclined surface lies in a range from 110 degrees to an angle smaller than 180 degrees in the power semiconductor unit in any one of the first through third modes.

According to a fifth mode of the invention, it is preferable that the power semiconductor element has the electrodes on both the front and rear surfaces of the power semiconductor element in the power semiconductor unit according to any one of the first through fourth modes. In this case, the electrode lead frame has a first electrode lead frame to which the electrode surface on the rear surface of the power semiconductor element is joined, and a second electrode lead frame to which the electrode surface on the front surface of the power semiconductor element is joined. An uneven step which has a step side surface forming the inclined surface is provided at least on one of the first and second electrode lead frames.

According to a sixth mode of the invention, it is preferable that the power semiconductor unit according to the fifth mode further includes: a through hole formed at least in one of the first and second electrode lead frames and penetrating the area from the heat radiation surface to the junction surface; a metal joining body injected from the through hole into the clearance between the electrode surface and the junction surface in a melted condition, and solidified for metal-connection between the electrode surface and the junction surface; and a groove formed in the heat radiation surface of the electrode lead frame where the through hole is provided, and extended from the end of the electrode lead frame to the through hole. In this case, the through hole and the groove are covered with the mold material.

According to a seventh mode of the invention, it is preferable that the through hole is so formed as to penetrate the peripheral area of the junction surface in the power semiconductor unit according to the sixth mode.

An eighth mode of the invention is directed to a power module which includes: the power semiconductor unit according to any one of the fifth through seventh modes; a bottomed metal case which has first and second heat radiation walls opposed to each other and having a heat radiation fin on the outer circumferential surface of each of the first and second heat radiation walls, the power semiconductor unit being inserted into the metal case such that the inner circumferential surface of the first heat radiation wall is opposed to the heat radiation surface of the first electrode lead frame, and that the inner circumferential surface of the second heat radiation wall is opposed to the heat radiation surface of the second electrode lead frame; a first heat conductive insulation sheet disposed in close contact with the inner circumferential surface of the first heat radiation wall and the heat radiation surface of the first electrode lead frame; and a second heat conductive insulation sheet disposed in close contact with the inner circumferential surface of the second heat radiation wall and the heat radiation surface of the second electrode lead frame.

According to a ninth mode of the invention, it is preferable that the metal case has a first thin portion formed around the first heat radiation wall and having a smaller thickness than the thickness of the first heat radiation wall, and a second thin portion formed around the second heat radiation wall and having a smaller thickness than the thickness of the second heat radiation wall in the power module according to the eighth mode. In this case, the first and second thin portions are plastically deformed in such a manner that the power semiconductor unit can be held by the first and second heat radiation walls.

According to a tenth mode of the invention, it is preferable that each of the first and second heat conductive insulation sheets includes a highly heat conductive layer which contains a volume percentage in a range from 50% to 90% insulation inorganic material having a heat conductivity of 5 W/mK or higher in heat setting resin, and closely contacting layers made of the heat setting resin and formed on the front and rear surfaces of the highly heat conductive layer in the power module according to the eighth or ninth mode.

According to an eleventh mode of the invention, it is preferable that the closely contacting layer contains a volume percentage larger than 50% epoxy modified polyamide imide resin as the heat setting resin, and has a structure where silicon resin having an average particle diameter of 5 μm or smaller is micro-phase separated in the epoxy modified polyamide imide resin corresponding to matrix resin in the power module according to the tenth mode.

A twelfth mode of the invention is directed to a method for manufacturing a power semiconductor unit, which method applies lasers to the peripheral area of the mold material projecting in such a manner as to surround the heat radiation surface of the power semiconductor unit according to the second mode to form the inclined surface.

A thirteenth mode of the invention is directed to a method for manufacturing a power semiconductor unit, which method includes: a first step which metal-joins the electrode surface of the power semiconductor element to the junction surface of the electrode lead frame provided on the power semiconductor unit according to the third mode; a second step which disposes a flexible mold release sheet between the heat radiation surface of the electrode lead frame and a transfer metal mold; and a third step which presses the transfer metal mold against the heat radiation surface of the electrode lead frame to execute transfer molding with the heat radiation surface sunk in the flexible mold release sheet.

A fourteenth mode of the invention is directed to a method for manufacturing a power module, which method includes: a first press-bonding step which press-bonds the first and second heat conductive insulation sheets to the heat radiation surfaces of the first and second electrode lead frames of the power semiconductor unit provided on the power module according to the tenth or eleventh mode under the press-bonding conditions of a temperature of 140° C. or lower, a pressure of 2 MPa or lower, an atmospheric pressure of 10 kPa or lower, and a press-bonding time of 15 minutes or shorter; and a second press-bonding step which press-bonds the respective inner circumferential surfaces of the first and second heat radiation walls to the first and second heat conductive insulation sheets press-bonded to the power semiconductor unit under the press-bonding conditions of a temperature of 130° C. or higher, a pressure of 5 MPa or lower, an atmospheric pressure of 10 kPa or lower, and a press-bonding time of 5 minutes or longer.

Advantageous Effects of Invention

According to the invention, prevention of void generation, and improvement of reliability are both achieved.

DESCRIPTION OF EMBODIMENTS

Embodiments according to the invention are hereinafter described with reference to the drawings.

—First Embodiment—

Figure 1:
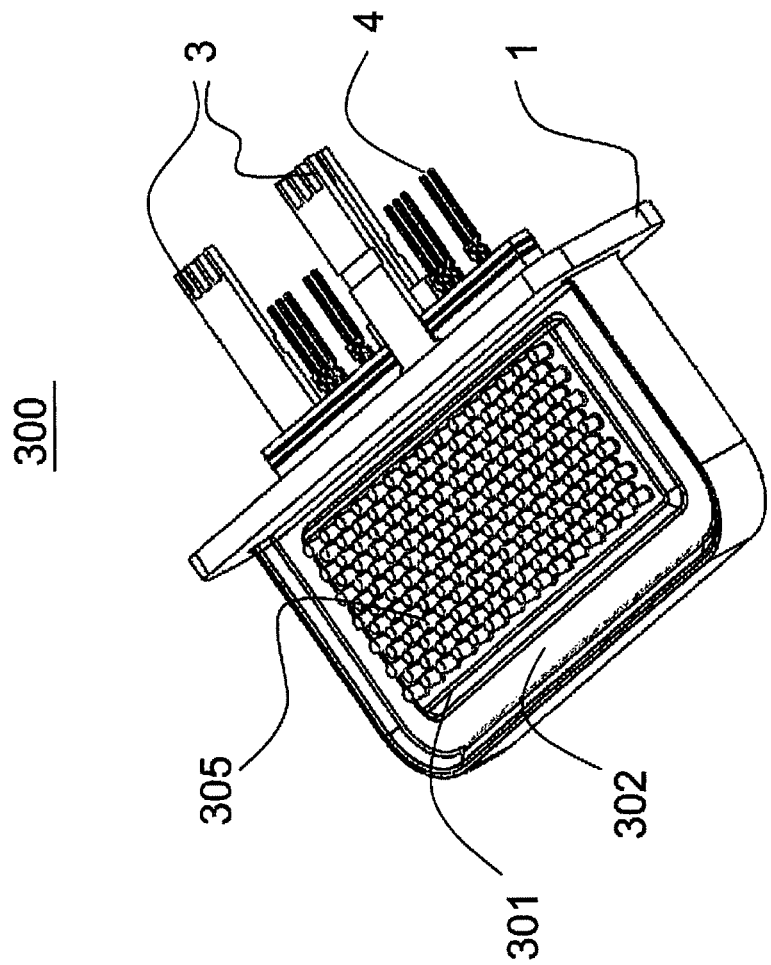
FIG. 1 illustrates the external appearance of a power module according to the invention.

FIG. 1 illustrates the external appearance of a power module according to the invention. A power module 300 includes a power semiconductor unit formed by transfer molding in such a shape as to accommodate switching elements, and housed within a metal case 1. The power module 300 is incorporated in a power converter mounted on an electric vehicle such as an electric automobile and a hybrid automobile.

Each of the side surfaces of the metal case 1 has a thick portion 301 from which a plurality of heat radiation fins 305 project, and a thin portion 302 surrounding the thick portion 301. As will be explained below, the heat radiation surface of the power semiconductor unit housed inside and the inner circumferential surface of the thick portion 301 are brought into close contact with each other by plastic deformation of the thin portion 302. Major current terminals 3 and signal terminals 4 provided on the power semiconductor unit project from one surface of the metal case 1.

Figure 2:
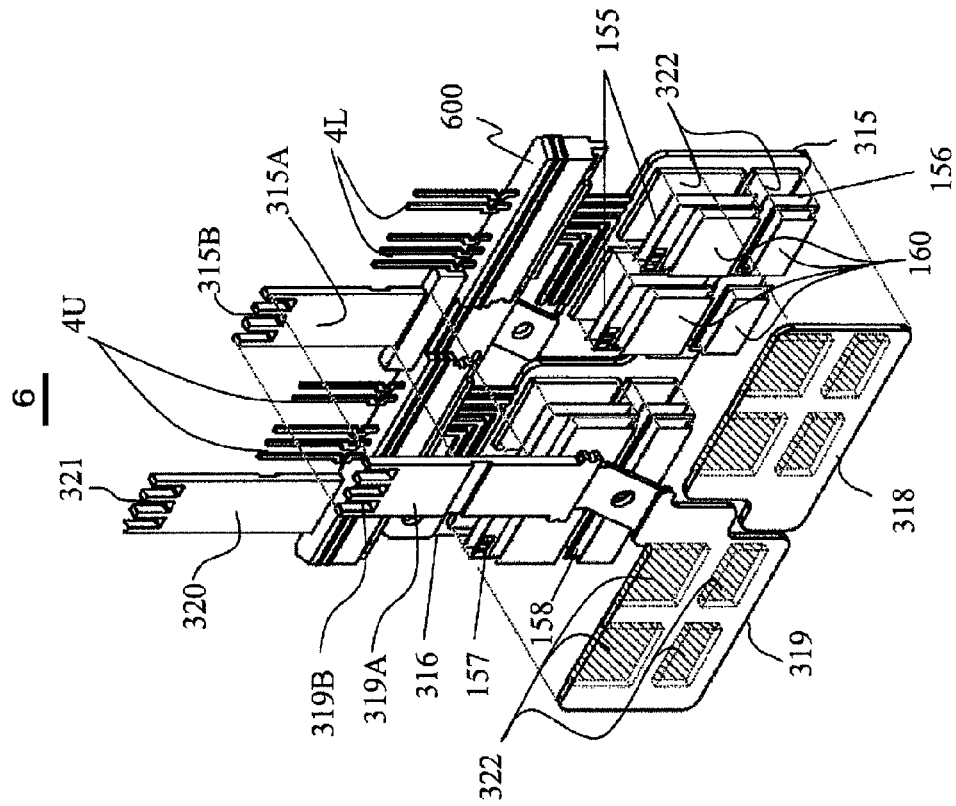
FIG. 2 is a perspective view of a power semiconductor unit in a disassembled condition.
Figure 3:
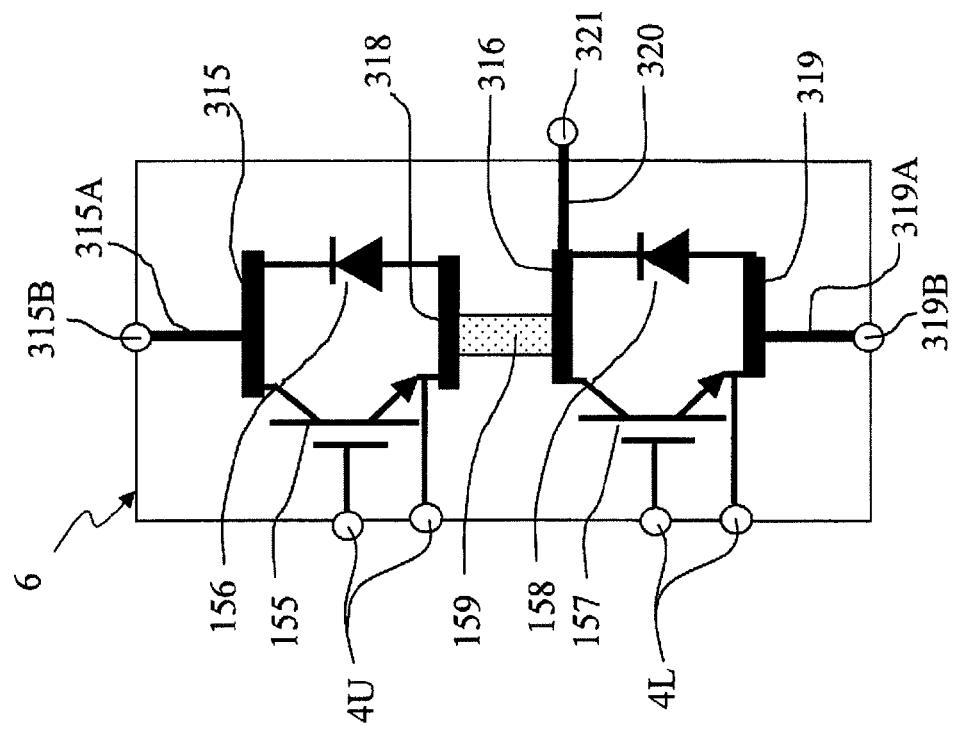
FIG. 3 is a circuit diagram of the power semiconductor unit.

FIG. 2 is a perspective view illustrating a power semiconductor unit 6 in a disassembled condition. FIG. 3 is a circuit diagram of the power semiconductor unit 6. FIG. 2 does not show the transfer mold. According to this embodiment, IGBTs (insulation gate type bipolar transistors) 155 and 157, and diodes 156 and 158 are equipped as power semiconductor elements. In the case of the example shown in FIG. 2, each of the IGBTs 155 and 157 and the diodes 156 and 158 is constituted by a pair of pieces disposed in parallel. However, in the circuit diagram of FIG. 3, only one of the pair of the pieces is shown for simplifying the explanation. A direct current positive electrode lead frame 315 and a first alternating current electrode lead frame 316 are disposed substantially on the same plane and on one side with respect to the power semiconductor elements, while a second alternating current electrode lead frame 318 and a direct current negative electrode lead frame 319 are disposed substantially on the same plane and on the other side with respect to the power semiconductor elements.

Each of the power semiconductor elements has plate-shaped flat structure which includes respective electrodes on its front and rear surfaces. A collector electrode of the upper arm IGBT 155 and a cathode electrode of the upper arm diode 156 are fixed to element fixing portions 322 of the direct current positive electrode lead frame 315 via solder 160 corresponding to a metal joining body. On the other hand, a collector electrode of the lower arm IGBT 157 and a cathode electrode of the lower arm diode 158 are fixed to the element fixing portions 322 of the first alternating current electrode lead frame 316 via the solder 160 corresponding to a metal joining body. It is preferable that the metal joining body is solder containing tin as a chief component. However, the metal joining body may be made of material containing gold, silver, or copper as a chief component, or material of wax or paste.

An emitter electrode of the upper arm IGBT 155 and an anode electrode of the upper arm diode 156 are fixed to the element fixing portions 322 of the second alternating current electrode lead frame 318 via the solder 160 corresponding to a metal joining body. On the other hand, an emitter electrode of the lower arm IGBT 157 and an anode electrode of the lower arm diode 158 are fixed to the element fixing portions 322 of the direct current negative electrode lead frame 319 via the solder 160 corresponding to a metal joining body. The metal joining body may be produced from a low-temperature sintered joining material or the like containing silver sheets or fine metal particles instead of solder, by which body the respective power semiconductor elements and the lead frames can be electrically and thermally joined with each other.

As illustrated in FIG. 2, the direct current positive electrode lead frame 315 and the second alternating current electrode lead frame 318 are disposed opposed to each other and substantially in parallel with each other with the IGBT 155 and the diode 156 as the power semiconductor elements interposed between the frames 315 and 318. Similarly, the first alternating current electrode lead frame 316 and the direct current negative electrode lead frame 319 are disposed opposed to each other and substantially in parallel with each other with the IGBT 157 and the diode 158 as the power semiconductor elements interposed between the frames 316 and 319. As illustrated in FIG. 3, the first alternating current electrode lead frame 316 and the second alternating current electrode lead frame 318 are connected with each other via an intermediate electrode 159. According to this structure, the upper arm circuit and the lower arm circuit are electrically connected with each other by the junction of the intermediate electrode 159, thereby constituting an upper-lower arm serial circuit as illustrated in FIG. 3.

A direct current positive wiring 315A is formed integrally with the direct current positive electrode lead frame 315. A direct current positive terminal 315B is provided at the tip of the direct current positive wiring 315A. Similarly, a direct current negative wiring 319A is formed integrally with the direct current negative electrode lead frame 319. A direct current negative terminal 319B is provided at the tip of the direct current negative wiring 319A. Furthermore, an alternating current wiring 320 is formed integrally with the first alternating current electrode lead frame 316. An alternating current terminal 321 is provided at the tip of the alternating current wiring 320.

A thermoplastic resin terminal block 600 is interposed between the direct current positive wiring 315A and the direct current negative wiring 319A. The direct current positive wiring 315A and the direct current negative wiring 319A disposed opposed to each other and substantially in parallel with each other project and extend from the metal case 1. Signal terminals 4L and 4U are formed integrally with the thermoplastic resin terminal block 600, and project and extend from the metal case 1 in the same direction as the extending direction of the direct current positive wiring 315A and the direct current negative wiring 319A. This structure can secure insulation between the direct current positive wiring 315A and the direct current negative wiring 319A, and insulation between signal wirings and respective wiring boards, thereby allowing high-density wiring structure to be formed.

A suitable resin material for forming the thermoplastic resin terminal block 600 is a thermoplastic resin which has heat resistance to a temperature higher than the metal mold temperature of transfer molding (such as 180° C. or higher)

and insulation. For example, the thermoplastic resin terminal block 600 is made of polyphenylene sulfide (PPS) or liquid crystal polymer (LCP).

The structure which disposes the direct current positive wiring 315A and the direct current negative wiring 319A opposed to each other and substantially in parallel with each other offers the following advantages. According to this structure, current flowing instantaneously at the time of switching operation of the power semiconductor elements flows in the opposite directions in the direct current positive wiring 315A and the direct current negative wiring 319A disposed opposed to each other. In this case, the magnetic fields produced by the current flowing in the opposite directions are cancelled by each other. Accordingly, inductance can be lowered.

Figure 4:
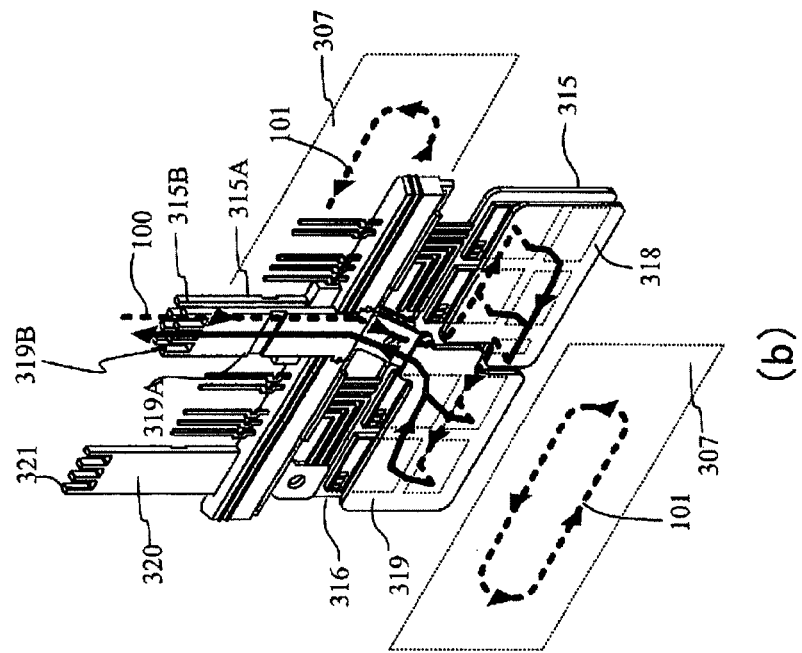
FIG. 4 illustrates the effect of inductance reduction.
Figure 4:
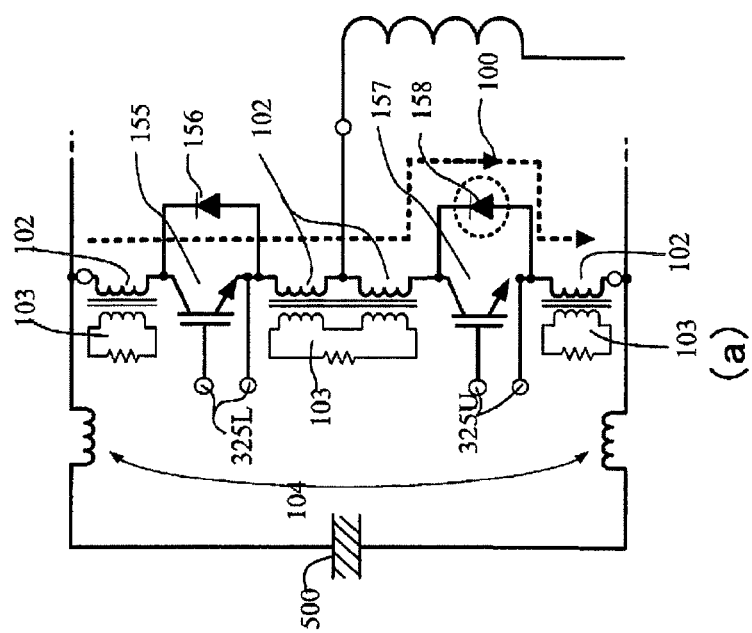

The mechanism of this inductance drop is now explained with reference to FIG. 4. It is assumed that the lower arm diode 158 has continuity in the forward bias condition as illustrated in FIG. 4(a). When the upper arm IGBT 155 is turned on under this condition, the lower arm diode 158 comes into the reverse bias condition, whereby recovery current generated by carrier mobility penetrates the upper and lower arms. At this time, recovery current 100 shown in FIG. 4(b) flows in the respective electrode lead frames 315, 316, 318, and 319.

As indicated by a dotted line, the recovery current 100 passes through the direct current positive terminal 315B disposed in parallel with the direct current negative terminal 319B, and then flows in a loop-shaped route formed by the respective electrode lead frames 315, 316, 318, and 319, and again passes through the direct current positive terminal 315B disposed in parallel with the direct current negative terminal 319B as indicated by a solid line. This flow of current along the loop-shaped route produces eddy current 101 in a heat radiation base 307. This eddy current 101 decreases wiring inductance 102 generated in the loop-shaped route by the effect of magnetic field cancellation. The inductance drop increases as the current route becomes closer to a loop shape.

According to this embodiment, the loop-shaped current route passes along a route close to the terminal of the electrode lead frame 315 as indicated by a dotted line, and passes along a route away from the terminal of the electrode lead frame 318 as indicated by a solid line after passing through the inside of the semiconductor elements. Then, the current route passes along a route away from the terminal of the electrode lead frame 316 as indicated by a dotted line, and further passes along a route close to the terminal of the electrode lead frame 319 as indicated by a solid line after again passing through the inside of the semiconductor elements. As a result, the current route passing close to and away from the direct current positive terminal 315B and the direct current negative terminal 319B forms a loop-shaped circuit, in which condition the recovery current 100 flowing in the loop-shaped circuit generates the eddy current 101 flowing in the heat radiation base 307. Accordingly, the reluctance decreases by cancellation between the magnetic field of the eddy current 101 and the magnetic field of the recovery current 100.

Figure 5:
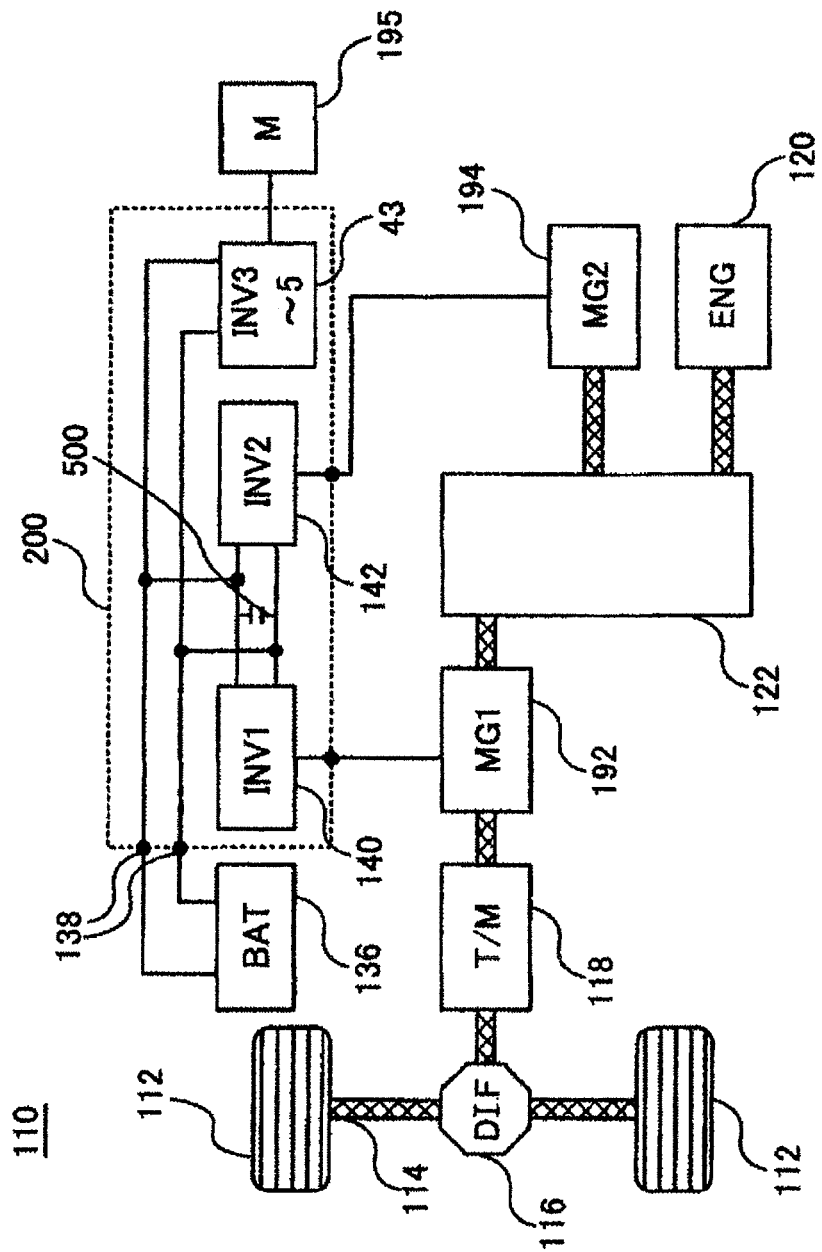
FIG. 5 is a control block diagram of a hybrid automobile on which an inverter provided with a power module 300 is mounted.

FIG. 5 is a control block diagram of a hybrid automobile on which an inverter including the power module 300 shown in FIG. 1 is mounted. A hybrid automobile (HEV) 110 has two vehicle driving systems. One of the systems is an engine driving system driven by a power source of an engine 120, while the other is an electrical rotating machine driving system driven by a power source of motor generators 192 and 194. The motor generator in this context is a motor functioning as a motor or a generator switched in accordance with control.

A pair of front wheels 112 are disposed on the front part of the vehicle body, and front wheel axles 114 connected with the front wheels 112 are joined to the output side of a differential gear (DEF) 116. The input side of the front wheel side DEF 116 connects with a transmission (T/M) 118. The input side of the transmission 118 connects with the output side of a motor generator (MG1) 192. The input side of the motor generator 192 connects with the output side of an engine (ENG) 120 or the output side of a motor generator (MG2) 194 via a power distribution mechanism 122. The motor generators 192 and 194 and the power distribution mechanism 122 are accommodated in the housing of the transmission 118.

The motor generators 192 and 194 are constituted by induction machines or synchronous machines. According to this embodiment, the motor generators 192 and 194 are synchronous machines each of which has a rotor as a permanent magnet and achieves high efficiency. The operations and characteristics of the motor generators 192 and 194 functioning as motors or generators are controlled by adjustment of the alternating current power supplied to stator windings provided on stators of the induction machines or on the synchronous machines by using inverter circuit units 140 and 142. The inverter circuit units 140 and 142 connect with a battery 136 for transfer of power between the battery 136 and the inverter circuit units 140 and 142.

The HEV 110 has a first motor generator unit including the motor generator 192 and the inverter circuit unit 140, and a second motor generator unit including the motor generator 194 and the inverter circuit unit 142, and switches operations of the first and second motor generator units according to the driving condition. More specifically, for assistance to the driving torque of the vehicle under the condition of the vehicle driven by the power from the engine 120, the second motor generator unit is actuated by the power of the engine 120 to generate electricity as the generator unit. In this case, the first motor generator unit is actuated by the power generated by the second motor generator unit to function as the motor unit. On the other hand, for assistance to the speed of the vehicle under the same condition, the first motor generator unit is actuated by the power of the engine 120 to generate electricity as the generator unit. In this case, the second motor generator unit is actuated by the power generated by the first motor generator unit to function as the motor unit.

When the first motor generator unit is actuated by the power of the battery 136 to function as the motor unit, the vehicle can be driven only by the power of the motor generator 192. On the other hand, when the first motor generator unit or the second motor generator unit is actuated by the power of the engine 120 or the power from the wheels to generate electricity as the generator unit, the battery 136 can be charged.

The battery 136 also functions as a power source for driving an auxiliary motor 195. The auxiliary motor corresponds to a motor for driving a compressor of an air conditioner, or a motor for driving a control hydraulic pump, for example. The direct current power supplied from the battery 136 to an inverter circuit unit 43 is converted into alternating current power at the auxiliary inverter circuit unit 43, and supplied to the motor 195. The auxiliary inverter circuit unit 43 has a function similar to those of the inverter circuit units 140 and 142 to control the phase, frequency, and power of the alternating current supplied to the motor 195. For example, the motor 195 generates torque when receiving alternating current power in the leading phase with respect to the rotation of the rotor of the motor 195. On the other hand, the motor 195 functions as a generator when generating alternating current power in the lagging phase. In this case, the motor 195 operates in the regenerative braking condition.

The control performance of the auxiliary inverter circuit unit 43 is similar to the control performances of the inverter circuit units 140 and 142. Since the capacity of the motor 195 is smaller than each capacity of the motor generators 192 and 194, the maximum conversion power of the auxiliary inverter circuit unit 43 is similarly smaller than each maximum conversion power of the inverter circuit units 140 and 142. However, the basic circuit structure of the auxiliary inverter circuit unit 43 is similar to each circuit structure of the inverter circuit units 140 and 142.

FIG. 5 does not show a constant-voltage power source. Respective control circuits and sensors are driven by power supplied from a not-shown constant-voltage power source. This constant-voltage power source is a 14-volt power source, for example, and has a 14-volt battery, or a 24-volt battery in some cases, of a lead battery or others. The positive electrode or the negative electrode of the constant-voltage power source connects with the vehicle body, using the vehicle body as a power supply conductor of the constant-voltage power source.

There is a close electrical relationship between the inverter circuit units 140, 142 and 43 and a capacitor module 500. Moreover, both the inverter circuit units 140, 142 and 43 and the capacitor module 500 require appropriate measures for enduring heat generation. Furthermore, reduction of the device volume to the minimum is desired. Considering these points, a power converter 200 explained in detail below accommodates the inverter circuit units 140, 142, and 43 and the capacitor module 500 within the housing of the power converter 200. This structure can miniaturize the device, and reduce the number of harnesses and radiation noise, for example. Therefore, these advantages offer size reduction and improvement of reliability, and further increase productivity. In addition, this structure can shorten the lengths of the connection circuits between the capacitor module 500 and the inverter circuit units 140, 142, and 43, or allow the construction described below. According to this structure, the inductance decreases, wherefore spike voltage lowers. Moreover, the construction described below can decrease heat generation and improve heat radiation efficiency.

Figure 6:
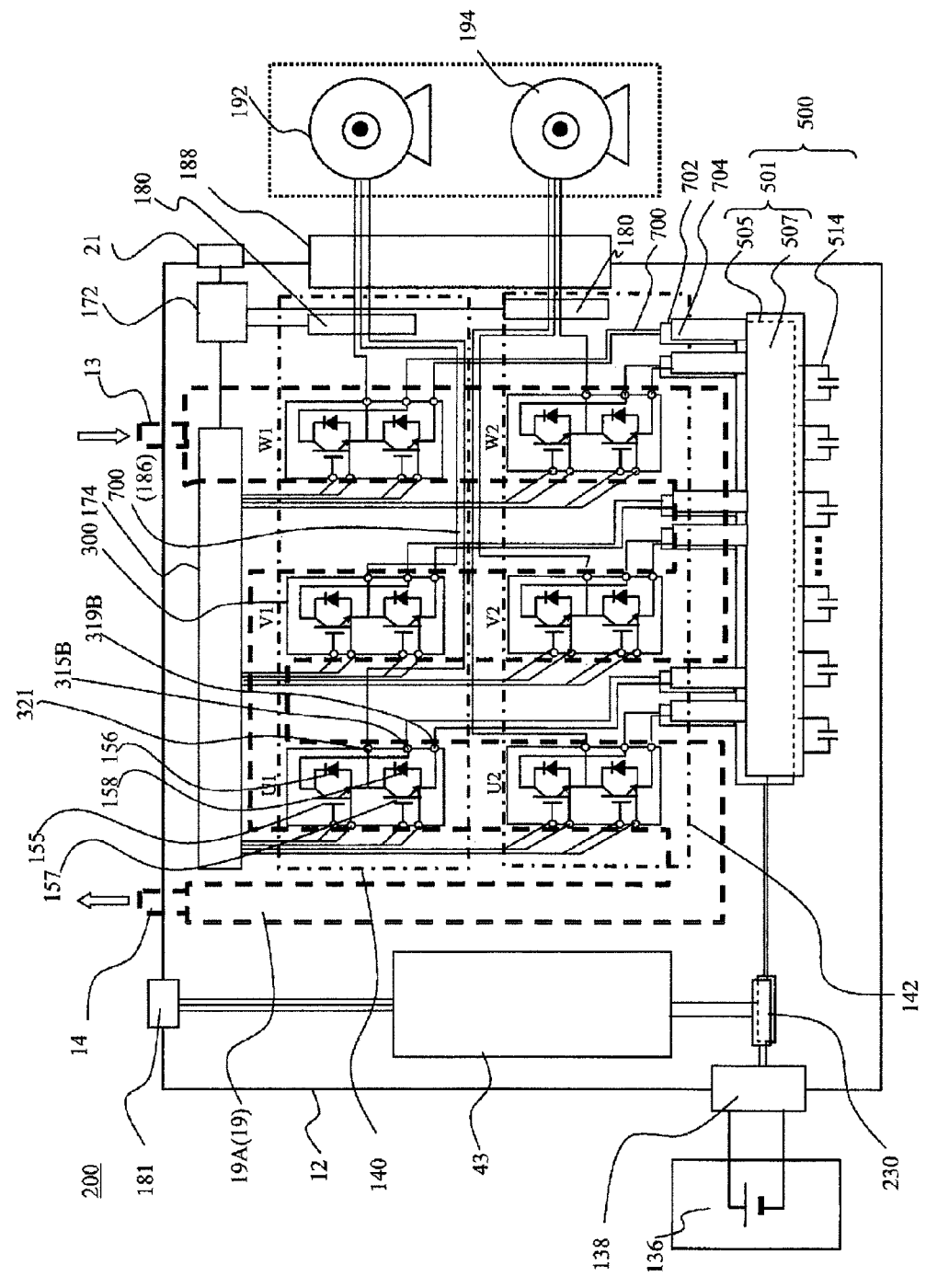
FIG. 6 is a circuit diagram showing a power converter 200.

FIG. 6 is a circuit diagram of the power converter 200. The power converter 200 includes the inverter circuit units 140 and 142, the auxiliary inverter circuit 43, and the capacitor module 500. Each of the inverter circuit units 140 and 142 has a plurality of the power modules 300 provided with cooling structure on both sides, and connects these power modules 300 to form a three-phase bridge circuit. According to the example shown in FIG. 6, there are provided three power modules 300. When the current capacity is large, parallel connection of a larger number of the power modules 300 is provided in correspondence with the respective phases of the three-phase inverter circuit so as to agree with current capacity increase. Alternatively, parallel connection of the semiconductor elements contained in each of the power modules 300 may be employed to agree with current capacity increase.

The driving of the respective inverter circuit units 140 and 142 is controlled by two driver circuits equipped on a controller. FIG. 6 shows the two driver circuits collectively as a driver circuit 174. The respective driver circuits are controlled by a control circuit 172. The control circuit 172 generates switching signals for controlling the switching timing of the power semiconductor elements.

The inverter circuit unit 140 and the inverter circuit unit 142 have the same basic circuit structure whose control method and operation are basically similar. In the following description, the inverter circuit unit 140 is discussed as an example. The inverter circuit unit 140 has a basic structure constituted by a three-phase bridge circuit. More specifically, respective arm circuits functioning as U-phase (represented by a reference number U1), V-phase (represented by a reference number V1), and W-phase (represented by a reference number W1) are connected in parallel and joined with the positive electrode side and negative electrode side conductors transmitting direct current power. In the figure, arm circuits functioning as the U-phase, V-phase, and W-phase of the inverter circuit unit 142 are designated by reference numbers U2, V2, and W2 similarly to the inverter circuit unit 140.

Each of the arm circuits in the respective phases is constituted by an upper-lower-arm serial circuit provided with an upper arm circuit and a lower arm circuit connected in series. The upper arm circuits in the respective phases are connected to the positive electrode side conductors, while the lower arm circuits in the respective phases are connected to the negative electrode side conductors. Alternating current power is generated from the respective junctions between the upper arm circuits and the lower arm circuits. The junctions between the upper arm circuits and the lower arm circuits of the respective upper-lower-arm serial circuits are connected with the alternating current terminals 321 of the corresponding power modules 300. The alternating current terminals 321 of the respective power modules 300 are connected with alternating current output terminals of the power converter 200 so that the generated alternating current power can be supplied to the stator winding of the motor generator 192 or 194. The power modules 300 in the respective phases have a similar basic structure operating basically in the same manner, wherefore only the power module U1 as the U-phase power module 300 is herein explained as an example.

The upper arm circuit has the upper arm IGBT 155 and the upper arm diode 156 as the switching power semiconductor elements. On the other hand, the lower arm circuit has the lower arm IGBT 157 and the lower arm diode 158 as the switching power semiconductor elements. The direct current positive electrode terminals 315 and the direct current negative electrode terminals 319 of the respective upper-lower-arm serial circuits are connected with capacitor connection direct current terminals of the capacitor module 500 so that alternating current power generated at the alternating current terminals 321 can be supplied to the motor generators 192 and 194.

The IGBTs 155 and 157 perform switching operation when receiving driving signals outputted from one or the other of the two driver circuits constituting the driver circuit 174, and convert the direct current power supplied from the battery 136 into three-phase alternating current power. The converted power is supplied to the stator winding of the motor generator 192. The V-phase and W-phase have substantially the same circuit structure as that of the U-phase, wherefore the reference numbers 155, 157, 156, and 158 of the V-phase and W-phase are not shown in the figure. The power modules 300 of the inverter circuit unit 142 has the same structure as that of the power modules 300 of the inverter circuit unit 140. Similarly, the auxiliary inverter circuit 43 has the same structure as that of the inverter circuit unit 142. Thus, the structures of the inverter circuit units 142 and 43 are not discussed herein.

The switching power semiconductor elements are now explained focusing on the upper arm IGBT 155 and the lower arm IGBT 157. Each of the upper arm IGBT 155 and the lower arm IGBT 157 has a collector electrode, an emitter electrode (signal emitter electrode terminal), and a gate electrode (gate electrode terminal). As illustrated in the figure, the upper arm diode 156 and the lower arm diode 166 are electrically connected between the collector electrode and the emitter electrode of each of the upper arm IGBT 155 and the lower arm IGBT 157.

Each of the upper arm diode 156 and the lower arm diode 158 has a pair of a cathode electrode and an anode electrode. The cathode electrodes of the diodes 156 and 158 are electrically connected with the collector electrodes of the IGBTs 155 and 157, while the anode electrodes of the diodes 156 and 158 are electrically connected with the emitter electrodes of the IGBTs 155 and 157, so that the directions from the emitter electrodes of the upper arm IGBT 155 and the lower arm IGBT 157 toward the collector electrodes thereof become the forward direction. Each of the power semiconductor elements may be constituted by MOSFET (metal-oxide-semiconductor-field-effect transistor). In this case, the upper arm diode 156 and the lower arm diode 158 can be eliminated.

The control circuit 172 generates timing signals for controlling the switching timing of the upper arm IGBT 155 and the lower arm IGBT 157 based on the information inputted from a vehicle side controller or sensor (such as a current sensor 180). The driver circuit 174 generates driving signals for allowing the upper arm IGBT 155 and the lower arm IGBT 157 to perform switching operation based on the timing signals outputted from the control circuit 172.

The control circuit 172 has a microcomputer (hereinafter abbreviated as "mc") which calculates the switching timing of the upper arm IGBT 155 and the lower arm IGBT 157. The mc receives input information about a target torque requested for the motor generator 192, current supplied from the upper-lower-arm serial circuit to the stator winding of the motor generator 192, and the magnetic pole position of the rotor of the motor generator 192.

The target torque is determined based on a command signal outputted from a not-shown host controller. The current is detected based on a detection signal outputted from the current sensor 180. The magnetic pole position is detected based on a detection signal outputted from a rotational magnetic pole sensor (not shown) provided on the motor generator 192. While the example which detects current in three phases has been discussed in this embodiment, current in two phases may be detected.

The mc included in the control circuit 172 calculates current command values on the d-axis and q-axis of the motor generator 192 based on the target torque, and calculates voltage command values on the d-axis and q-axis based on the difference from the detected current values on the d-axis and q-axis. Then, the mc converts the calculated voltage command values on the d-axis and q-axis into respective voltage command values in the U-phase, V-phase, and W-phase based on the detected magnet pole position. Subsequently, the mc generates modulated pulse waves based on comparison between the fundamental waves (sine waves) and the carrier waves (triangle waves) corresponding to the voltage command values in the U-phase, V-phase, and W-phase, and outputs the modulated waves thus generated to the driver circuit 174 as PWM (pulse width modulation) signals.

For driving the lower arm, the driver circuit 174 amplifies the PWM signal and outputs the amplified PWM signal to the gate electrode of the corresponding lower arm IGBT 157 as a driving signal. On the other hand, for driving the upper arm, the driver circuit 174 amplifies the PWM signal after shifting the level of the reference voltage of the PWM signal to the level of the reference voltage of the upper arm, and outputs the amplified PWM signal to the gate electrode of the corresponding upper arm IGBT 155 as a driving signal. The upper arm IGBT 155 and the lower arm IGBT 157 having received the driving signals perform switching operation in accordance with the driving signals.

Moreover, the controller detects abnormal conditions (such as overcurrent, overvoltage, and over-temperature) to protect the upper-lower-arm serial circuits. Therefore, the controller receives sensing information. For example, information on the current flowing in the emitter electrodes of the upper arm IGBT 155 and the lower arm IGBT 157 is inputted from the signal emitter electrode terminals of the respective arms to the corresponding driver circuit 174. The driver circuit 174 detects overcurrent based on the inputted information, and stops switching operation of the upper arm IGBT 155 and the lower arm IGBT 157 to protect the corresponding upper arm IGBT 155 and the lower arm IGBT 157 from overcurrent when detecting the presence of overcurrent.

The mc receives information on the temperature of the upper-lower-arm serial circuit from a temperature sensor (not shown) provided on the upper-lower-arm serial circuit. Moreover, the mc receives information on the direct current positive electrode side voltage of the upper-lower-arm serial circuit. The mc detects over-temperature and overvoltage based on the received information, and stops switching operation of all of the upper arm IGBTs 155 and the lower arm IGBTs 157 to protect the upper-lower-arm serial circuits from over-temperature or overvoltage when detecting the presence of over-temperature or overvoltage.

The continuity and cutoff of the upper arm IGBT 155 and the lower arm IGBT 157 of the inverter circuit unit 140 are switched in a fixed order. Current generated from the stator winding of the motor generator 192 during this switching flows in the circuit including the diodes 156 and 158. According to the power converter 200 in this embodiment, the one upper-lower-arm serial circuit is provided for each phase of the inverter circuit unit 140. However, as noted above, the power converter may have a circuit structure which connects two upper-lower-arm serial circuits in parallel for each phase as circuits generating outputs of alternating current in three phases to be supplied to the motor generator.

A direct current terminal 138 (see FIG. 5) provided on each of the inverter circuit units 140 and 142 is connected with a laminated electrode lead frame 700 constituted by a positive electrode lead frame and a negative electrode lead frame. The laminated electrode lead frame 700 has a triple-layered laminated wiring board which has a positive electrode lead frame 702 and a negative electrode lead frame 704 both constituted by conductive plates which are wide in the arrangement direction of the power modules 300, between which plates an insulation sheet (not shown) is sandwiched. The positive electrode lead frame 702 and the negative electrode lead frame 704 of the laminated electrode lead frame 700 are connected with a positive electrode lead frame 507 and a negative electrode lead frame 505 of a laminated wiring board 501 provided on the capacitor module 500, respectively. The positive electrode lead frame 507 and the negative electrode lead frame 505 are also constituted by conductive plates which are wide in the arrangement direction of the power modules, constituting a triple-layered laminated wiring board which holds an insulation sheet 517 (not shown) between the plates.

The capacitor module 500 includes a plurality of capacitor cells 514 connected in parallel. The positive electrodes of the capacitor cells 514 are connected with the positive electrode lead frame 507, while the negative electrodes of the capacitor cells 514 are connected with the negative electrode lead frame 505. The capacitor module 500 constitutes a smoothing circuit for reducing fluctuations of the direct voltage generated by the switching operations of the upper arm IGBT 155 and the lower arm IGBT 157.

The laminated wiring board 501 of the capacitor module 500 connects with an input laminated wiring board 230 joined with the direct current connector 138 of the power converter 200. The input laminated wiring board 230 further connects with an inverter device provided on the auxiliary inverter circuit unit 43. A noise filter is disposed between the input laminated wiring board 230 and the laminated wiring board 501. This noise filter includes two capacitors connecting a grounding terminal of a housing 12 and respective direct current power lines to constitute a Y-capacitor for preventing common mode noise.

The capacitor module 500 includes a terminal (no reference number given) connected to the direct current connector 138 which receives direct current power from the direct current power source 136, and a terminal connected with the inverter unit 140 or the inverter circuit 142 as separate terminals. This structure reduces adverse effects on the direct current power source 136 caused by the noise generated from the inverter circuit 140 or the inverter circuit 142, thereby enhancing the effects of smoothing.

Moreover, the structure which connects the capacitor module 500 and the respective power modules 300 via the laminated electrode lead frames discussed above can decrease inductance affecting the current flowing in the upper-lower-arm serial circuits of the respective power modules 300, wherefore leap voltage produced by rapid change of the current decreases.

Figure 7:
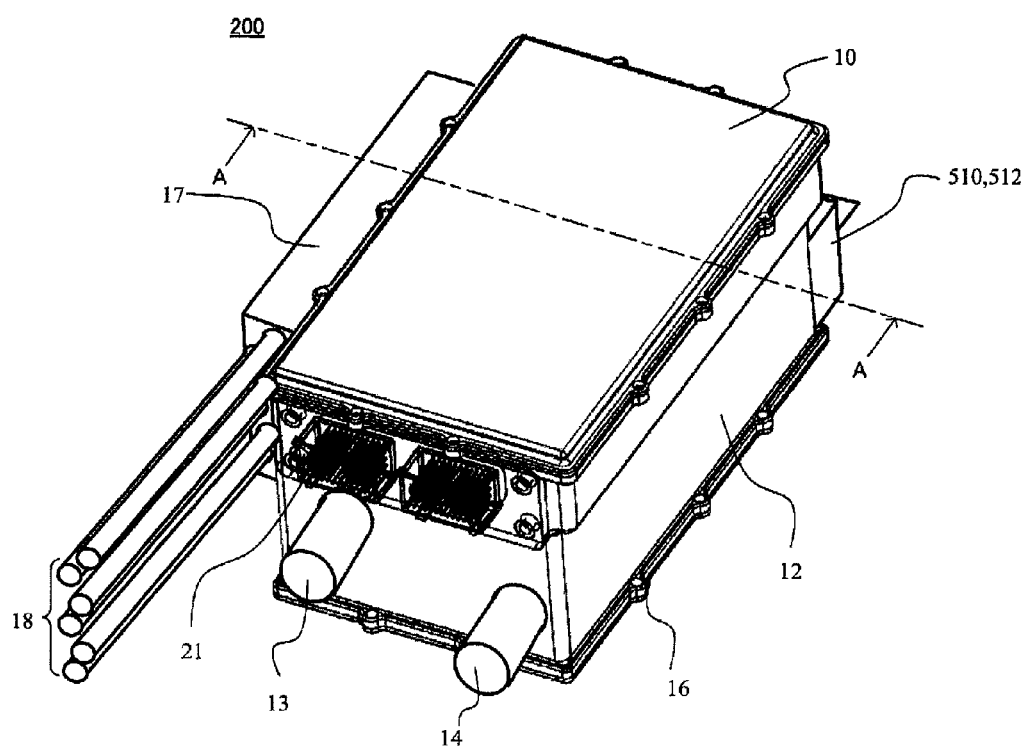
FIG. 7 is a perspective view illustrating the external appearance of the power converter 200.
Figure 8:
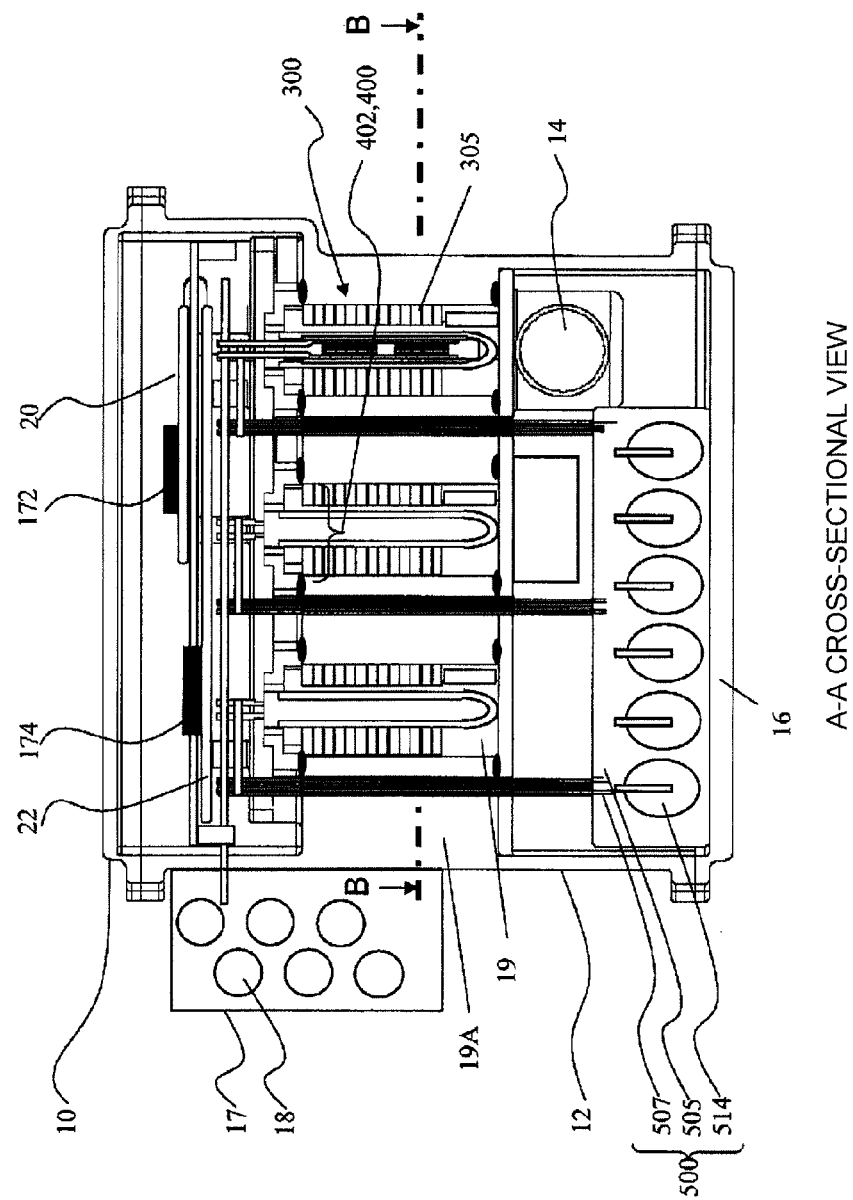
FIG. 8 is a cross-sectional view taken along a line A-A in FIG. 7.
Figure 9:
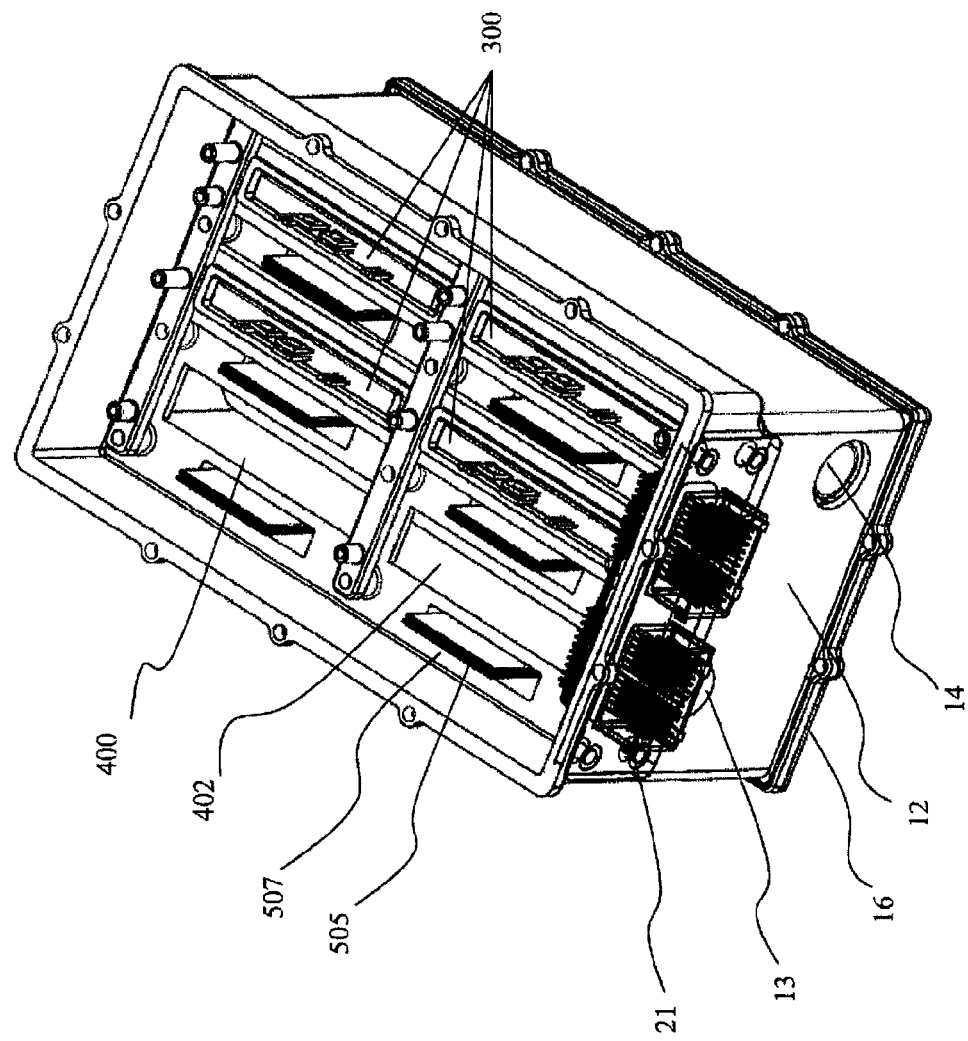
FIG. 9 is a perspective view illustrating the power converter 200.
Figure 10:
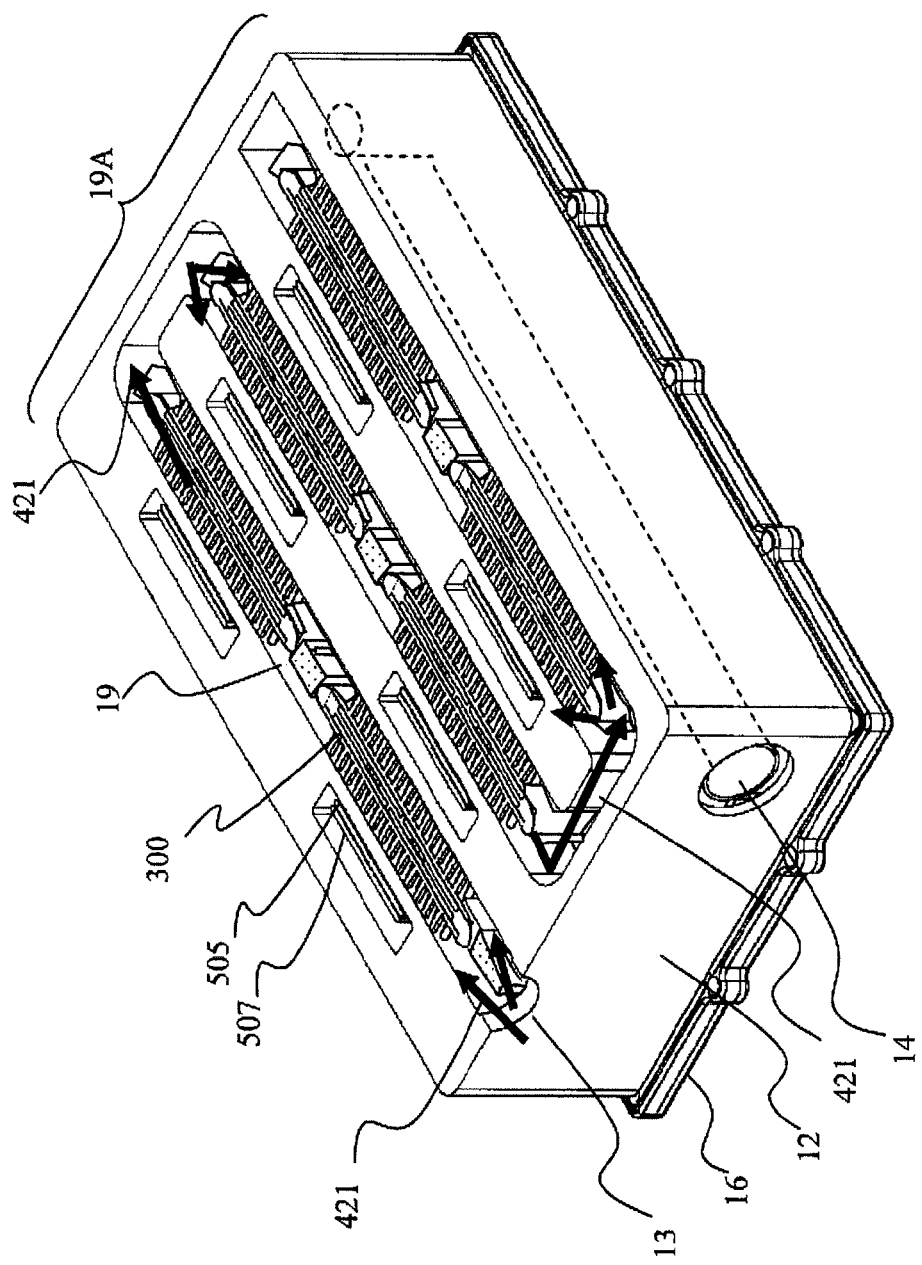
FIG. 10 is a cross-sectional view taken along a line B-B in FIG. 8.

FIG. 7 is a perspective view illustrating the external appearance of the power converter 200. FIG. 8 is a cross-sectional view taken along a line A-A in FIG. 7. FIG. 9 is a perspective view illustrating the power converter 200 shown in FIG. 7 from which an upper case 10 and an AC connector are removed. FIG. 10 is a cross-sectional view taken along a line B-B in FIG. 8. The external appearance of the power converter 200 in this embodiment is produced by fixing the housing 12 having a substantially rectangular upper or lower surface, the upper case 10 provided on one of the short sides of the outer circumference of the housing 12, and a lower case 16 which closes the lower opening of the housing 12. The substantially rectangular shape of the lower or upper surface of the housing 12 facilitates attachment of the housing 12 to the vehicle, and increases productivity of the housing 12.

An alternating current terminal case 17 provided with an alternating current terminal 18 is equipped on the long side of the outer circumference of the power converter 200. The alternating current terminal 18 electrically connects the power modules 300 and the motor generators 192 and 194 to transmit alternating current outputted from the power modules 300 to the motor generators 192 and 194. A connector 21 connects with a control circuit board 20 (see FIG. 8) contained in the housing 12 to transmit various signals received from the outside to the control circuit board 20. A direct current negative electrode connection terminal 510 and a direct current positive electrode connection terminal 512 electrically connect the battery 136 and the capacitor module 500.

As illustrated in FIG. 8, a cooling jacket 19A containing a water channel is formed in the middle area of the housing 12. The control circuit board 20 on which the control circuit 172 is mounted, and a driving circuit board 22 on which the driver circuit 174 is mounted are disposed in the upper space above the cooling jacket 19A. On the other hand, the capacitor module 500 is disposed in the lower space below the cooling jacket 19A. The capacitor module 500 includes a plurality of capacitor cells 504.

The cooling jacket 19A has a water channel 19 through which cooling water flows. As illustrated in FIG. 9, a plurality of openings 400 and 402 through which the power modules 300 are inserted into the water channel are formed above the water channel. The power modules 300 are inserted through the openings 400 and 402 into the water channel, and fixed to the housing 12. The surfaces of the metal case 1 on which the heat radiation fins 305 are provided as illustrated in FIG. 1 are soaked in the cooling water so that the power modules 300 can be cooled by the cooling water.

FIG. 10 is a cross-sectional view taken along the line B-B in FIG. 8, illustrating a part of the cooling jacket 19A of the housing 12 containing the water channel 19. Cooling water flowing from a cooling water entrance 13 into the water channel 19 passes through the water channel 19 in a zigzag line in the direction indicated by arrows 421, and flows out through a cooling water exit 14. The six power modules 300 are disposed within the water channel 19 along the flow of the cooling water.

Figure 11:
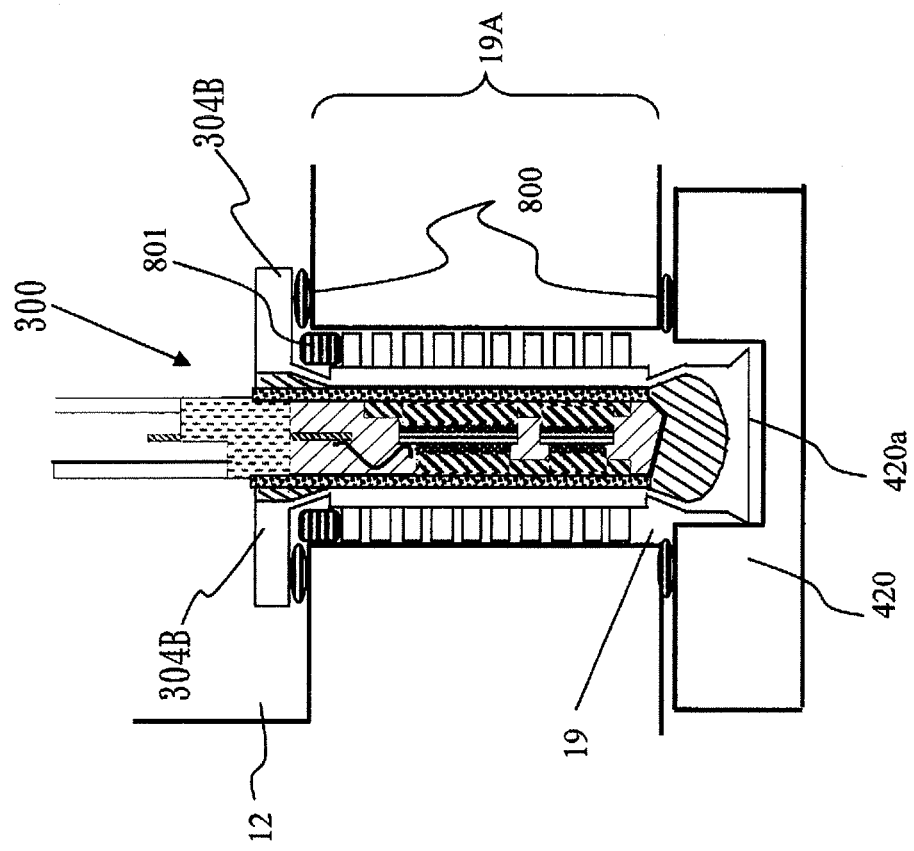
FIG. 11 is a cross-sectional view of the power module 300 disposed within a water channel.

FIG. 11 is a cross-sectional view illustrating the power module 300 disposed within the water channel. As noted above, the cooling jacket 19A containing the water channel 19 of cooling water is formed within the housing 12. A rear cover 420 for covering the bottom surface of the water channel 19 is attached to the bottom surface of the cooling jacket 19A. The lower end of the metal case 1 of the power module 300 fixed to the cooling jacket 19A projects from the water channel 19 of the cooling jacket 19A toward below to be accommodated within a recess 420a formed in the rear cover 420. The clearance between the rear cover 420 and the cooling jacket 19A, and the clearance between a flange 304B of the power module 300 and the cooling jacket 19A are sealed by seals 800 and 801.

Figure 12:
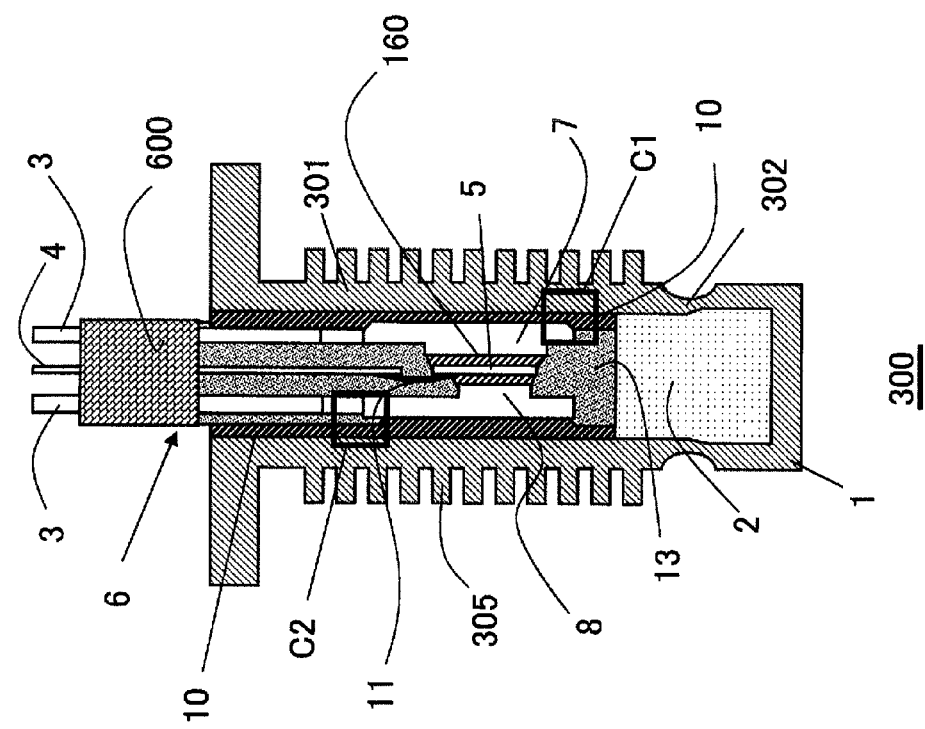
FIG. 12 is a cross-sectional view schematically illustrating the power module 300.

FIG. 12 is a cross-sectional view schematically illustrating the power module 300 according to this embodiment. FIG. 12 shows the cross section of a part where a power semiconductor element 5 is provided, corresponding to the cross section of the part where the IGBT 155 in FIG. 2 is disposed, for example. According to the example shown in FIG. 2, the IGBT 155 and the diode 156 are disposed in parallel in the extending direction of the electrode lead frames. However, FIG. 12 does not show the diode, and illustrates only the IGBT 155 as the power semiconductor element 5. Components designated by reference numbers 7 and 8 are electrode lead frames. Components designated by a reference number 3 are major current terminals formed integrally with the electrode lead frames, corresponding to the direct current positive terminal 315B, the direct current negative terminal 319B, and the alternating current terminal 321 shown in FIG. 2. A signal terminal 4 corresponds to the signal terminals 4L and 4U shown in FIG. 2. It is preferable that the electrode lead frames, which are required to have high heat conductivity and high strength, contains copper as a chief component. However, the electrode lead frames may contain aluminum as a chief component.

The power module 300 houses the power semiconductor unit 6 discussed above within the metal case 1. The clearance between the power semiconductor unit 6 and the metal case 1 is filled with potting resin 2. The power semiconductor unit provided with the power semiconductor element 5, the electrode lead frames 7 and 8 and others is formed by transfer molding using a sealing material 13, and housed in the area of the thick portions 301 inside the metal case 1. The power semiconductor element 5 has electrodes on the chip front and rear surfaces. The electrode lead frame 7 is joined with the rear surface of the power semiconductor element 5, while the electrode lead frame 8 is joined with the front surface of the power semiconductor element 5.

The control electrode (gate electrode of IGBT) provided on the front surface of the power semiconductor element 5 is connected to the signal terminal 4 via an aluminum wire bonding 11. The signal terminal 4 is formed in the terminal block 600 by insert molding. The terminal block 600 is made of thermoplastic resin such as polyphenylene sulfide (PPS). The terminal block 600 is inserted between the two major current terminals 3.

The electrode lead frames 7 and 8 are produced by press blanking, and have chamfered end surfaces facing to the metal case 1. Insulation sheets 10 for maintaining electric insulation are disposed between the metal case 1 and the electrode lead frame 7 and between the metal case 1 and the electrode lead frame 8. The insulation sheets 10, the details of which will be described later, are made of heat setting resin. The insulation sheets 10 before hardening are press-bonded to the heat radiation surfaces of the electrode lead frames 7 and 8 to prevent generation of voids (small cavities) between the insulation sheets 10 and the heat radiation surfaces.

Figure 13:
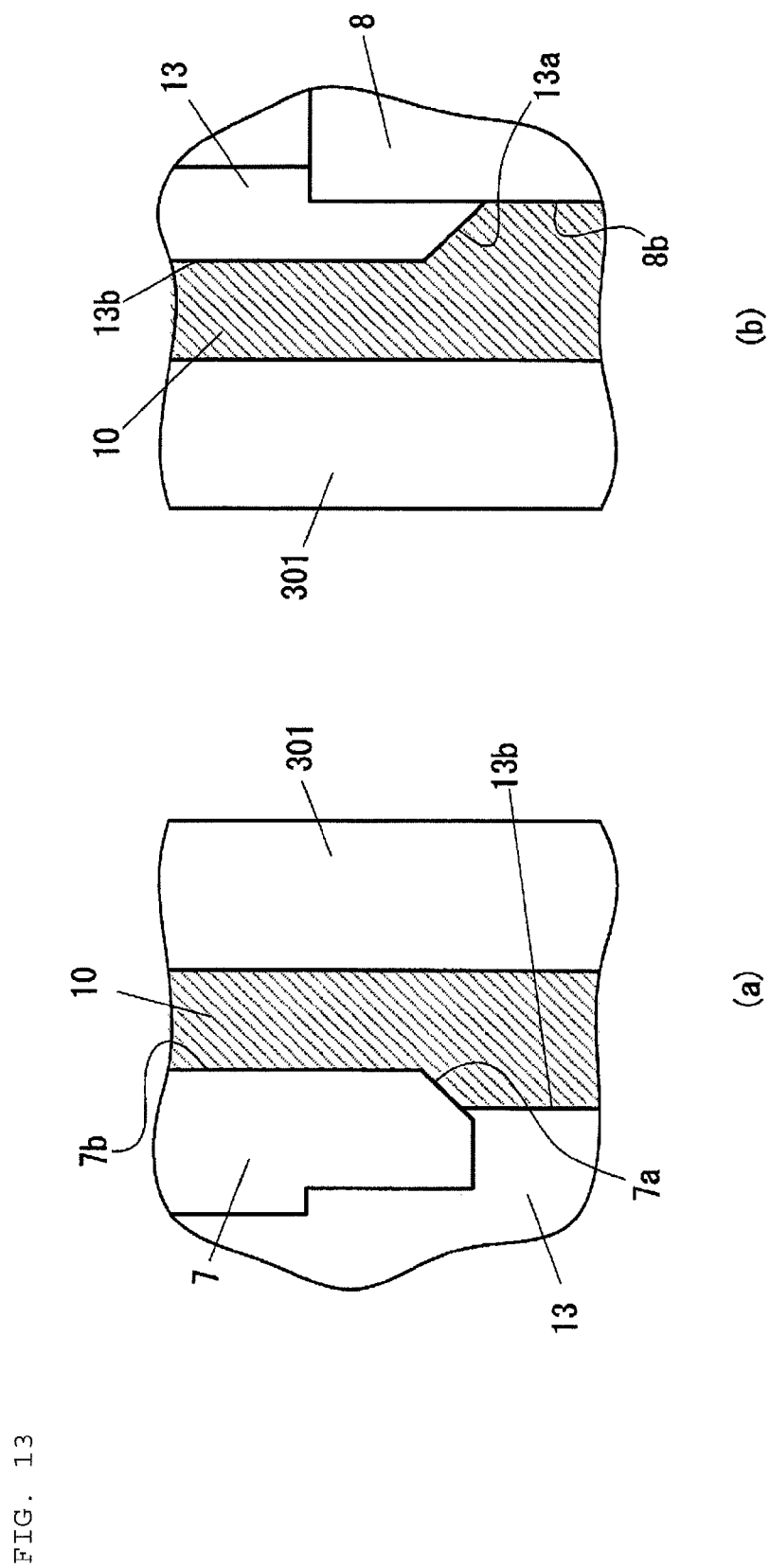
FIG. 13 is an enlarged view of areas indicated by reference numbers C1 and C2 in FIG. 12.

The areas indicated by reference numbers C1 and C2 in FIG. 12 are regions where voids are easily produced. FIGS. 13(a) and 13(b) are enlarged views of the areas indicated by the reference numbers C1 and C2. Steps are easily produced between the heat radiation surface of the electrode lead frame 7 and a sealing material surface 13b and between the heat radiation surface of the electrode lead frame 8 and the sealing material surface 13b at the time of transfer molding, and voids easily develop at the steps thus produced. According to this embodiment, an inclined surface 7a is formed at the end of the electrode lead frame 7 by chamfering when a heat radiation surface 7b projects from the sealing material surface 13b as illustrated in FIG. 13(a). On the other hand, when a heat radiation surface 8b is recessed from the sealing material surface 13b as illustrated in FIG. 13(b), an inclined surface 13a is formed on the sealing material 13. This structure can prevent development of voids in the steps between the surface of the sealing material 13 and the heat radiation surface of the electrode lead frame 7 and between the surface of the sealing material 13 and the heat radiation surface of the electrode lead frame 8.

Figure 14:
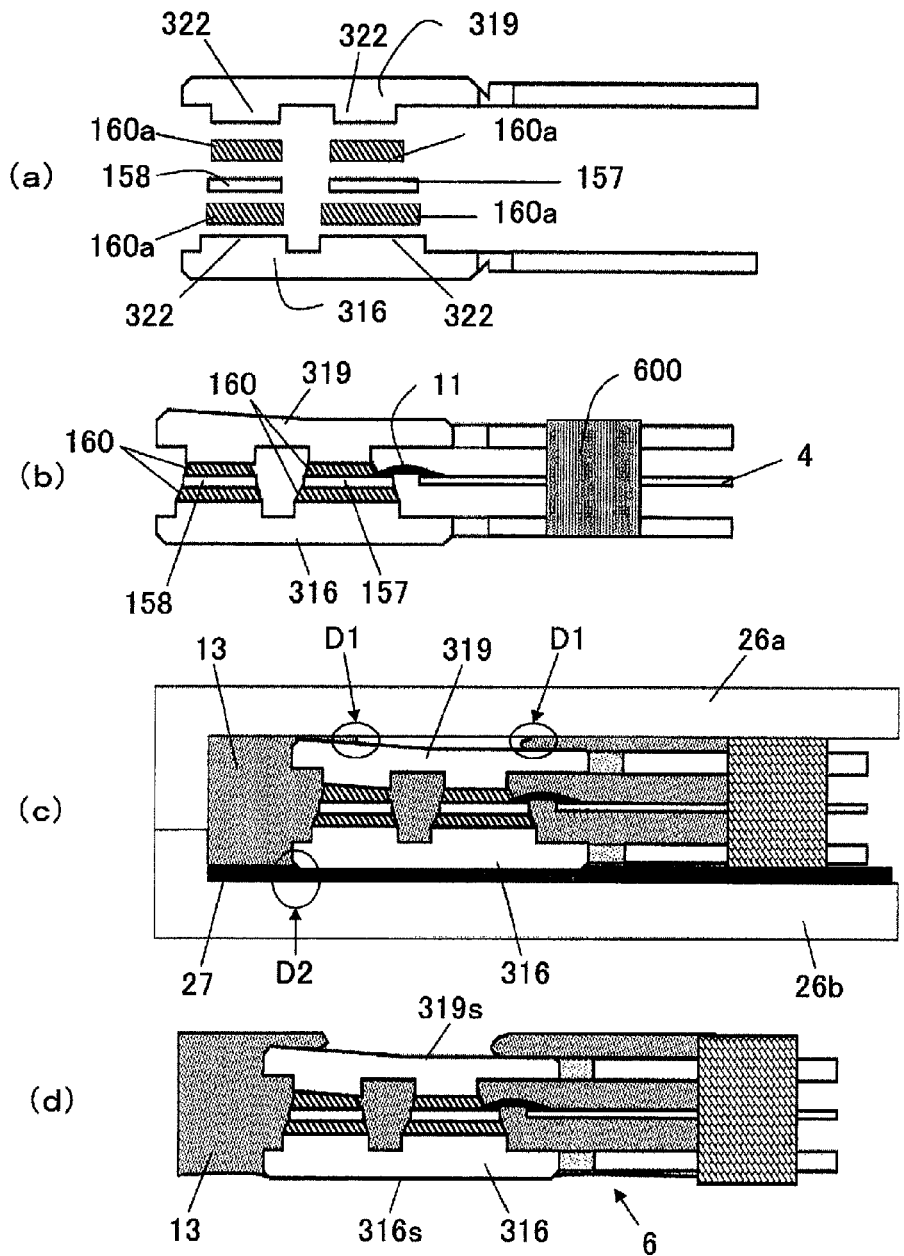
FIG. 14 illustrates a method for manufacturing a power semiconductor unit.

FIG. 14 illustrates a method for manufacturing the power semiconductor unit by transfer molding. The figure shows processes for producing the part including the IGBT 157, the diode 158, and the electrode lead frames 316 and 319 shown in FIG. 2 as an example. The IGBT 157 has the emitter electrode and the gate electrode on the upper side (chip front surface side) in the figure, and the collector electrode on the lower side (chip rear surface side) in the figure.

Initially, in a step shown in FIG. 14(a), solder sheets 160a are placed on the element fixing portions 322 of the collector side electrode lead frame 316, and the IGBT 157 and the diode 158 are placed on the solder sheets 160a. Then, the solder sheets 160a are further placed on the IGBT 157 and the diode 158, and the emitter side electrode lead frame 319 is placed on these solder sheets 160a.

In the subsequent step shown in FIG. 14(b), these components are subjected to collective reflow to fix the IGBT 157 and the diode 158 to the electrode lead frames 316 and 139 via the solder 160 for electrical connection between the IGBT 157 and the diode 158 and the electrode lead frames 316 and 139. In this case, the heights of the junction bodies vary, or the upper side electrode lead frame 319 tilts due to variations of the dimensions of the soldering. Discussed below is a case in which the electrode lead frame 319 tilts in such a manner that the end portion of the electrode lead frame 319 is positioned higher than the other portions by approximately 75 μm.

The terminal block 600 made of thermoplastic resin in which the signal terminal 4 is formed by insert molding is inserted between the terminals (major current terminals 3 in FIG. 12) extended from the collector side and emitter side electrode lead frames 316 and 319. Then, the gate electrode of the IGBT 157 is electrically connected with the signal terminal 4 by the aluminum wire bonding 11.

In a step shown in FIG. 14(c), a flexible mold release sheet 27 is placed on the lower mold 26b of transfer metal molds 26a and 26b, and a lead frame structure produced in the step shown in FIG. 4(b) is placed on the mold release sheet 27. In this case, the collector side electrode lead frame 316 is positioned on the side facing to the mold release sheet 27. Then, the upper and lower metal molds 26a and 26b are clamped, and transfer molding is executed under the condition of a metal mold temperature of 175° C. and a pressure of 10 MPa.

According to this transfer molding, the dimensions of the metal molds and the thickness of the mold release sheet 27 are determined such that the electrode lead frame 316 sinks in the mold release sheet 27 at the time of clamping of the metal molds. More specifically, the metal mold dimensions are determined considering variations of the height of the lead frame structure at the time of production thereof, and an appropriate thickness of the mold release sheet 27 is selected such that the electrode lead frame 316 can sink in the mold release sheet 27 by a predetermined amount (such as approximately 25 μm).

As a consequence, the electrode lead frame 316 sinks in the mold release sheet 27 as indicated by a reference number D2, whereby a heat radiation surface 316s of the electrode lead frame 316 projects from the surface of the sealing material 13 as illustrated in FIG. 14(d). FIG. 14(d) shows the power semiconductor unit 6 from which the transfer metal molds 26a and 26b set in the condition shown in FIG. 14(c), and the mold release sheet 27 are all removed.

On the other hand, as for the emitter side electrode lead frame 319, the electrode lead frame end thereof which has the largest height contacts the upper mold 26a, while a clearance is produced between the other areas of the electrode lead frame 319 and the upper mold 26a as illustrated in FIG. 14(c). In this case, the sealing material 13 reaches the heat radiation surface 319s of the electrode lead frame 319 as indicated by a reference number D1 in FIG. 14(c). The shape of the periphery of the sealing material 13 reaching the heat radiation surface 319s tends to have a reversely tapered shape for the heat radiation surface 319s of the electrode lead frame 319 due to the surface tension and other factors.

Figure 15:
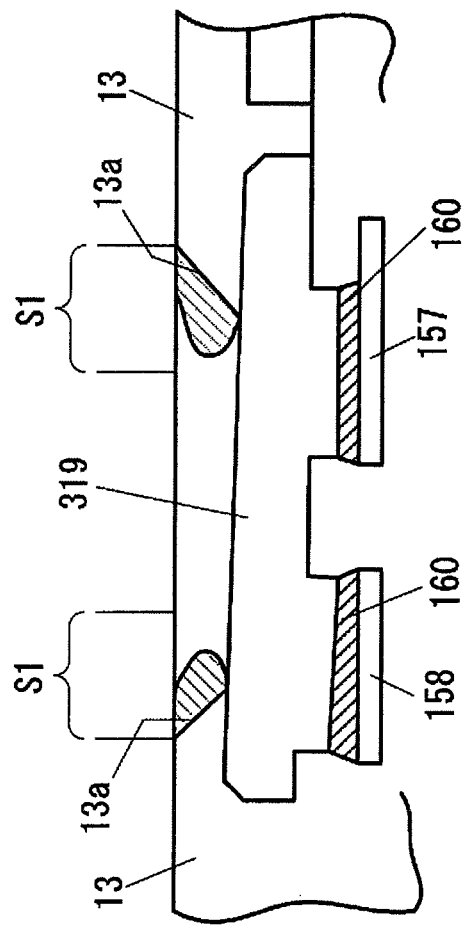
FIG. 15 illustrates laser processing applied to step portions of a sealing material 13.

According to this embodiment, a part of the steps (hatched portions) of the sealing material 13 reaching the upper surface of the electrode lead frame 319 are removed to produce smooth inclined surfaces 13a on the steps as illustrated in FIG. 15. The sealing material 13 may be removed by using a machine or lasers. For example, when the sealing material 13 is removed by irradiation of carbon dioxide gas lasers, a laser irradiation range S1 is set inside the outer circumferential edge of the electrode lead frame 319 as illustrated in FIG. 15. This is because the sealing material is cut so deeply as to produce a sharp step at the corresponding position when laser beams are applied to the area outside the outer circumference of the electrode lead frame 319. The edge of the sealing material 13 reaching the electrode lead frame 319 is adjusted to the shape of the inclined surface 13a shown in FIG. 15 by controlling the radiation intensity of the lasers.

Figure 16:
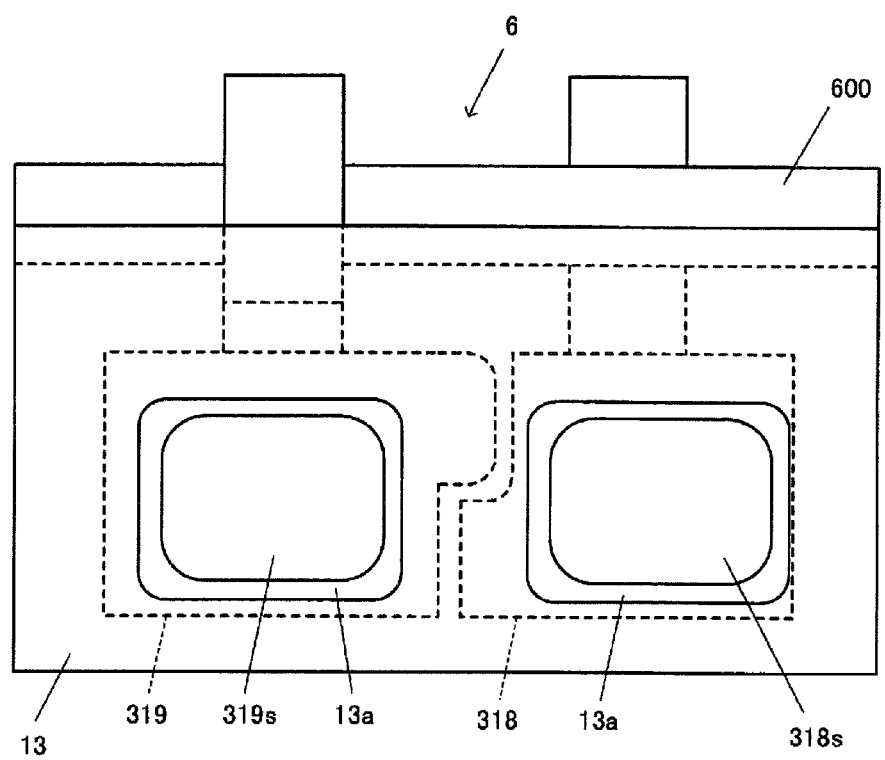
FIG. 16 is a plan view of a power semiconductor unit 6 after inclined surfaces are formed.

FIG. 16 is a plan view of the power semiconductor unit 6 after formation of the inclined surfaces. The central areas of the electrode lead frames 318 and 319 formed by molding of the sealing material 13 are exposed through the sealing material 13 while surrounded by the sealing material 13 lying on the circumferences of a heat radiation surface 318s and the heat radiation surface 319s. As illustrated in FIG. 14d, the edges of the sealing material 13 contacting the circumferences of exposed areas 318A and 319A have step shapes. However, the inclined surfaces 13a produced by the laser radiation discussed above are formed to surround the exposed areas 318A and 319A.

As illustrated in FIG. 12, the power semiconductor unit 6 shown in FIG. 16 is inserted into the metal case 1 to produce the power module 300. In this case, the insulation sheets 10 are disposed between the front surface of the power semiconductor unit 6 and the inner circumferential surface of the metal case 1 and between the rear surface of the power semiconductor unit 6 and the inner circumferential surface of the metal case 1. As will be described below, the insulation sheets 10 are press-bonded to both the front and rear surfaces of the power semiconductor unit 6. During this process, voids are easily produced in the areas indicated by the reference numbers D1 and D2 in FIG. 14(c).

According to this embodiment, the inclined surface 13a discussed above is formed at the edge of the sealing material in the area D1 for the purpose of prevention of void generation in the areas D1 and D2. As for the area D2, an inclined surface 316c (corresponding to the inclined surface 7a of the electrode lead frame 7 in FIG. 13) is produced by chamfering the end of the electrode lead frame 316, and transfer molding is performed while the electrode lead frame 316 is sinking in the mold release sheet 27 as illustrated in FIG. 14(c).

Figure 17:
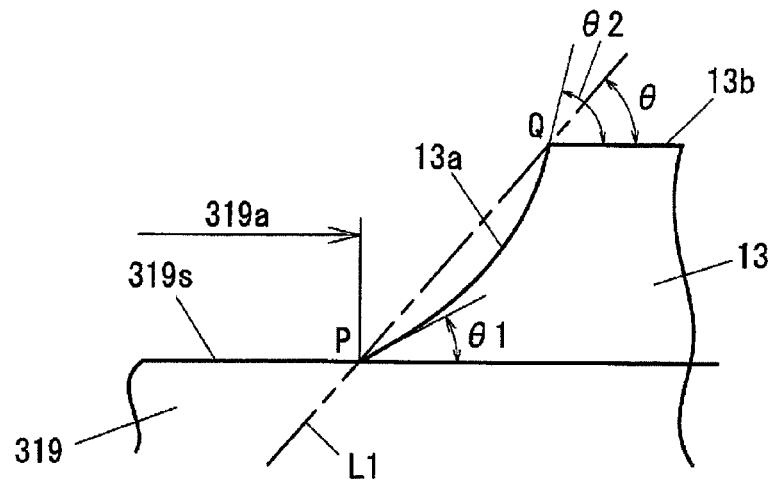
FIG. 17 is an enlarged view of areas D1 and D2 after inclined surfaces are formed.
Figure 17:
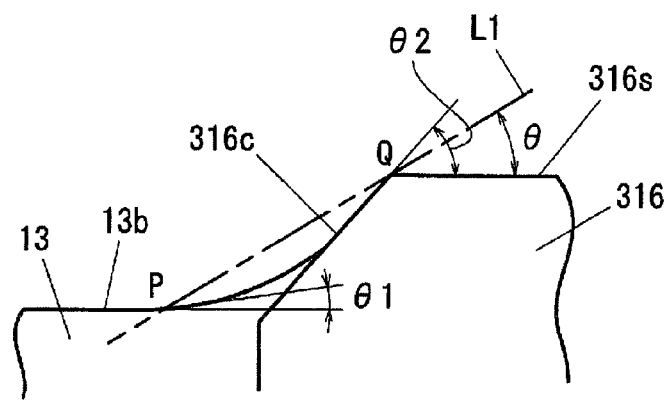

FIG. 17 is an enlarged view of the areas D1 and D2 after formation of the inclined surfaces discussed above, illustrating an example of the inclined surfaces 13a and 316c provided on the steps formed by the sealing material 13 and the heat radiation surfaces. Comparing the projections of the heat radiation surface and the surface 13b of the sealing material 13, the sealing material surface 13b projects more greatly in the area D1 as illustrated in FIG. 17(a), while the heat radiation surface 316s of the electrode lead frame 316 projects more greatly in the area D2 as illustrated in FIG. 17(b). In the case of the area D2, a part of the inclined surface 316c produced by chamfering sinks in the mold release sheet 27 as illustrated in FIG. 14(c). Thus, the area D2 has such a shape that a part of the sealing material 13 rides on the inclined surface 316c.

However, the inclined surfaces on both the steps have a similar shape. Assuming that the intersections of the projecting surface and the inclined surface and of the recessed surface and the inclined surface are Q and P, respectively, it is considered that an inclination $\theta$ of a line L1 passing through the points P and Q represents the average inclination of an inclined surface PQ. The inclined surface PQ in this context refers to a curved surface extending from the point P to the point Q, and corresponds to a substantial inclined surface of the stepped structure.

The inclined surface in the area D2 is determined by the surface of the mold release sheet 27 and the chamfered portion of the electrode lead frame 316 (inclined surface 7a in FIG. 13(a)) when the electrode lead frame 316 is sunk in the mold release sheet 27. Thus, strictly speaking, the inclined surface of the stepped structure is difficult to become the flat surface defined by the line L1. However, the inclined surface 13a of the sealing material 13 shown in FIG. 17(a) can be a flat inclined surface indicated by the line L1.

Figure 18:
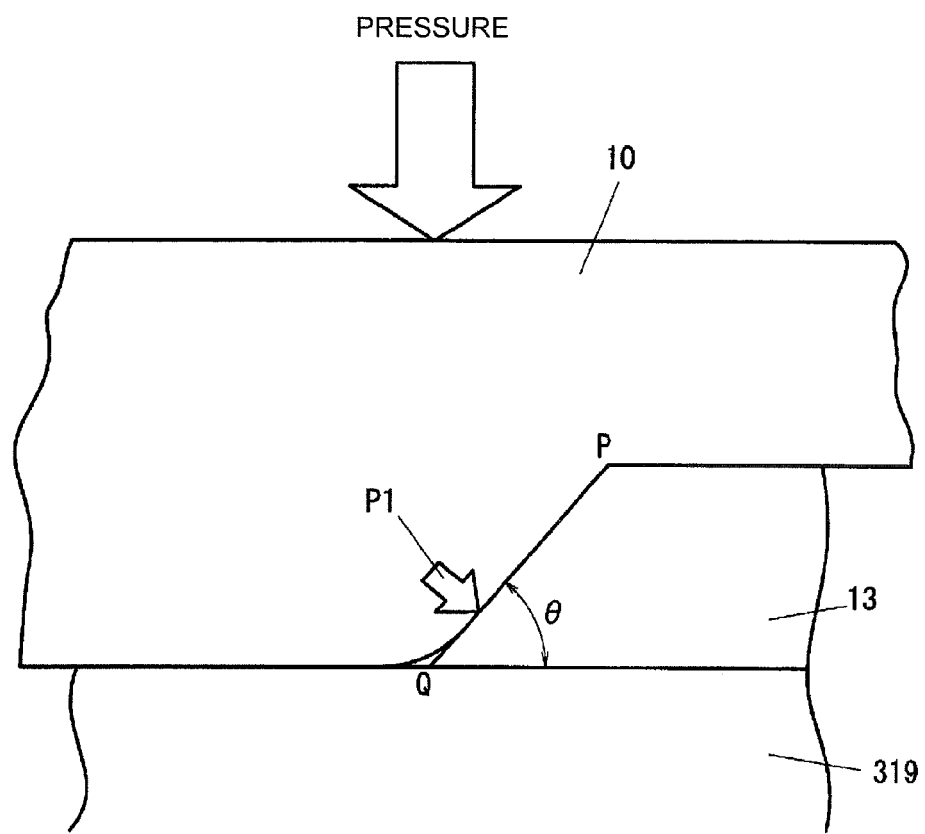
FIG. 18 illustrates the effect produced when a flat inclined surface PQ is formed.

FIG. 18 illustrates the advantage provided when the flat inclined surface PQ is formed. As noted above, voids are easily produced when the insulation sheets 10 are press-bonded to the front and rear surfaces of the power semiconductor unit 6. The insulation sheets 10 exhibit flexibility and fluidity when press-bonded as will be described in detail below. Therefore, when pressed from above as illustrated in the figure, a part of the insulation sheet 10 deforms along the surface shape of the power semiconductor unit 6 with no clearance left therebetween.

Figure 19:
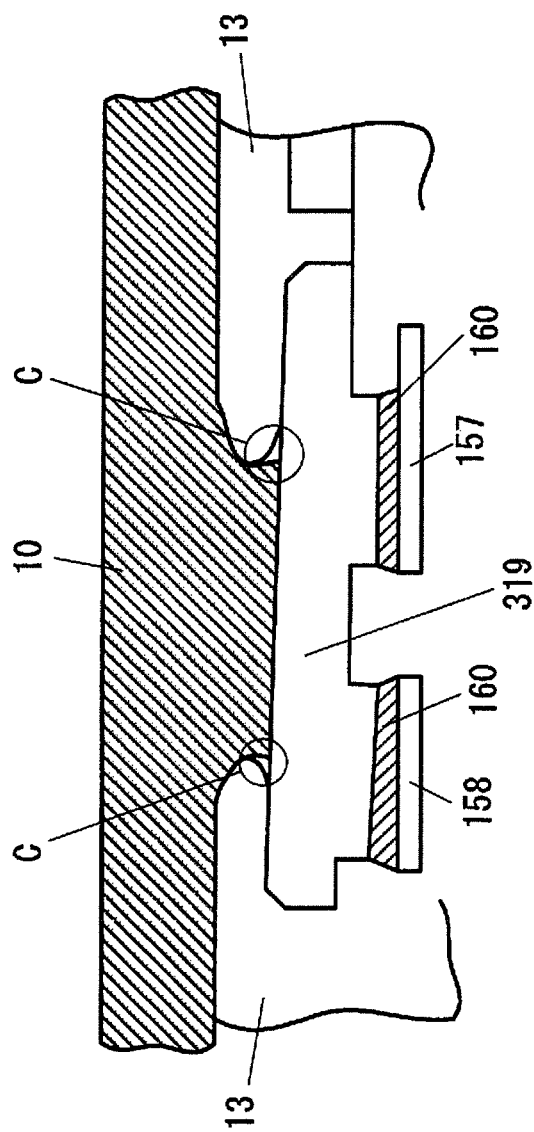
FIG. 19 illustrates a comparison example.

FIG. 19 illustrates a comparison example which does not have the inclined surfaces on the steps of the sealing material 13. According to this structure, spaces like pockets are formed at the edges (portions indicated by a reference number C) of the sealing material 13 reaching the upper surface of the heat radiation surface of the electrode lead frame 319. In this case, it is extremely difficult for the insulation sheet 10 to enter these spaces even when press-bonded under pressure, in which condition voids develop in the corresponding portions.

According to this embodiment, however, the smooth inclined surface PQ prevents generation of voids. The deformable insulation sheet 10 is pressed against the inclined surface PQ when pressure is applied thereto. In this case, a pressure P1 thus applied is dependent on an angle $\theta$ of the inclined surface PQ. The level of the pressure P1 is regarded as a vertical component of an applied pressure P0 with respect to the inclined surface PQ, and thus increases as the angle $\theta$ decreases. It is preferable that the pressure P1 acting to compress voids is higher. As will be described below, the applied pressure P0 is approximately 1 Mpa. In this case, it is preferable that the pressure P1 equivalent to one third of the applied pressure P0 or higher acts on the inclined surface PQ as a pressure force so as to prevent generation of voids. More specifically, it is preferable that the angle $\theta$ of the inclined surface PQ is set to 70 degrees or smaller. In other words, it is preferable that the angle formed by the inclined surface PQ and the heat radiation surface or the sealant surface adjacent to the inclined surface PQ becomes an obtuse angle which ranges from 110 degrees to an angle smaller than 180 degrees.

According to the example shown in FIGS. 17(a) and 17(b), the inclined surface PQ is curved, and the inclination angle in the vicinity of a point P1 is an angle $\theta 1$, while the inclination angle in the vicinity of a point Q1 is an angle $\theta 2$ (>$\theta 1$). While the flat inclined surface PQ in FIG. 18 has been discussed, it is more preferable that the curved inclined surface having the angles $\theta 1$ and $\theta 2$ shown in FIG. 17 is formed. According to this shape, the insulation sheet 10 flows by the pressure force applied to the heat radiation surface 319s of the electrode lead frame 319 in the vertical direction, thereby enhancing the effect of discharging the void on the heat radiation surface 319s toward the sides.

In fact, when the steps of the sealing material 13 do not have reversely tapering shapes as illustrated in FIG. 19, the voids can be compressed by increasing the pressure force applied at the time of press-bonding of the insulation sheet 10. However, there is a possibility of breakage of the semiconductor element when a large pressure force is applied thereto. Accordingly, it is desirable that each of the voids is compressed to approximately 7.5 μm or smaller by applying a pressure force small enough not to affect the insulation property. For this purpose, it is preferable that the angle of the inclined surface is 70 degrees or smaller as explained above.

Figure 20:
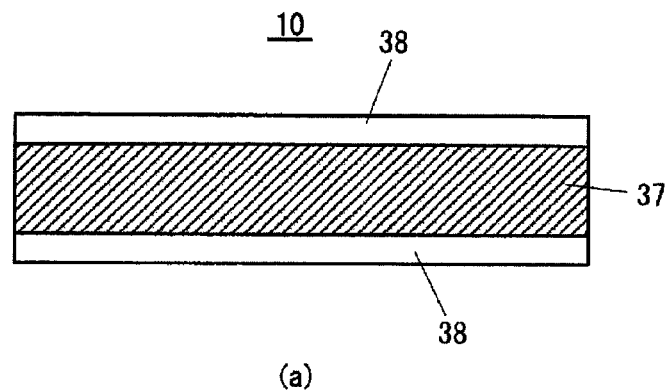
FIG. 20 illustrates an example of an insulation sheet 10.
Figure 20:
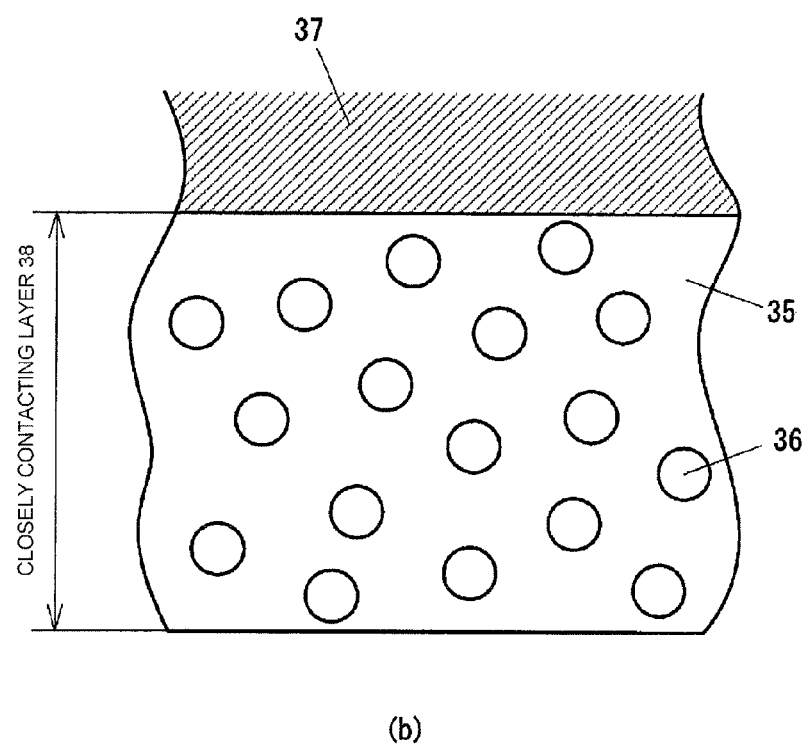

FIG. 20 illustrates an example of the insulation sheet 10, wherein FIG. 20(a) shows an example of triple-layered structure of the insulation sheet 10. A highly heat conductive layer 37 disposed at the center contains a volume percentage of 50% to 90% alumina filler as insulation inorganic material having heat conductivity of 5 W/mK or higher in the resin component. Examples of the insulation inorganic material having heat conductivity of 5 W/mK or higher include aluminum nitride and boron nitride as well as alumina filler. On the other hand, each of closely contacting layers 38 provided on the front and rear surfaces of the highly heat conductive layer 37 has a volume percentage higher than 50% resin component. According to this example, the resin component is constituted by epoxy modified polyamide imide resin. However, the resin component may be made of epoxy resin, bismaleimide resin, or other heat setting resin. Moreover, the highly heat conductive layer may be formed by a plurality of layers, or the closely contacting layers 38 may be formed by a plurality of layers, instead of the triple-layered structure. This structure constituted by plural layers can prevent deterioration of the insulation property caused by penetration of voids produced from voids or other defects contained in the respective layers. Moreover, processing such as alumite-treatment and roughing may be applied to the metal case to which the insulation sheet is press-bonded to improve contact between the metal case and the insulation sheet and allow direct bonding of the highly heat conductive layer to the metal case. Heat conductivity increases when the highly heat conductive layer is directly bonded to the metal case.

FIG. 20(b) is an enlarged view schematically illustrating an example of the closely contacting layer 38. The closely contacting layer 38 increases its adherence by containing a volume percentage of 50% or higher resin component. This adhesive force can further increase when isolated areas 36 made of silicon resin or the like and having an average particle diameter of approximately 1 μm are formed by micro-phase separation in a matrix resin 35 such as epoxy modified polyamide imide resin.

As illustrated in FIG. 12, it is preferable that the material of the insulation sheet 10 provided between the power semiconductor unit 6 and the metal case 1 has heat conductivity of 3 W/mK or higher, dielectric breakdown voltage of 20 kV/mm or higher, and adhesive strength of 10 Mpa or higher to the sealing material, the lead frames, and the metal case 1. When the heat conductivity of the insulation sheet 10 is set to 3 W/mK or higher, sufficient heat radiation can be achieved even through the insulation sheet 10 which has a thickness of 100 μm or larger for securing insulation reliability. Furthermore, when the adhesive strength of the insulation sheet 10 to the metal case 1 is set to 10 MPa or higher, the adhesive force becomes higher than stresses generated during the temperature cycle, wherefore the adhesion reliability rises.

According to this embodiment, the highly heat conductive layer 37 contains a volume percentage of 50% or higher alumina filler corresponding to inorganic material having insulating property and high heat conductivity so as to increase heat conductivity of the insulation sheet 10. However, this structure decreases the adhesive strength of the highly heat conductive layer 37. For overcoming this drawback, the highly heat conductive layer 37 and the closely contacting layer 38 containing a volume percentage of 50% or higher resin component are multilayered, providing the closely contacting layer 38 on both sides contacting the metal case 1 and the power semiconductor unit 6. In other words, the insulation sheet 10 has a multilayered structure shown in FIG. 20. As a result, high heat conductivity of 3 W/mK or higher (heat conductivity of 5 W/mK in this embodiment), and a high adhesive force of 10 MPa or higher can be both achieved.

The highly heat conductive layer 37 discussed above may be constituted by a ceramic plate. In this case, the insulation reliability further increases. However, when the highly heat conductive layer 37 includes a resin composition which contains a volume percentage of 50% or higher inorganic material having high heat conductivity, the highly heat conductive layer 37 becomes flexible and therefore is advantageous in view of flexibility along the surface shapes of the power semiconductor 6 and the metal case 1.

The transfer mold sealing material before hardening contains mold release agent such as polyethylene and stearic acid. The mold release agent is solid and not sticky at the room temperature, but becomes liquid at a temperature of 90° C. or higher. The mold release agent in the form of liquid has a lower solubility parameter than that of epoxy resin corresponding to the base resin of the sealing material, and therefore rises to the surface at the time of hardening of the sealing material to promote separation between the transfer metal mold and the sealing material. Therefore, adhesion of an adhesive to the sealing material to which no processing is applied after transfer molding is generally low due to the rising mold release agent. In most cases, the adhesion of the adhesive is raised by applying UV cleaning, plasma cleaning, laser irradiation, polishing or other processing for removing the mold release agent.

The present inventors found that the adhesion increases without the necessity of the mold release agent removal process when the closely contacting layer 38 contains the silicon resin 36 shown in FIG. 20(b), giving attention to silicon resin which has a solubility parameter close to that of the mold release agent. However, silicon resin has low elastic modulus and therefore decreases the adhesive strength. For overcoming this drawback, the present inventors examined the use of an adhesive containing micro-phase separation structure where fine silicon resin disperses in matrix resin having high elastic modulus. As a result, the inventors found that high adhesion of 10 MPa or higher can be realized without removing the mold release agent in the transfer mold sealing material when the closely contacting layer 38 of the insulation sheet 10 includes an adhesive which forms phase separation structure of fine silicon resin having an average particle diameter of 5 μm or smaller in epoxy modified polyamide imide matrix resin after the adhesive is hardened.

According to this embodiment, therefore, the insulation sheet 10 which has triple-layered structure including the highly heat conductive layer 37 sandwiched between the closely contacting layers 38 has high heat conductivity and adhesion. Accordingly, close contact of the insulation sheet 10 can be maintained without the necessity for continuously applying pressure for retaining the insulation sheet 10 after hardening of the insulation sheet 10 as required in PTL 1.

(Manufacturing Step of Power Module)

Figure 21:
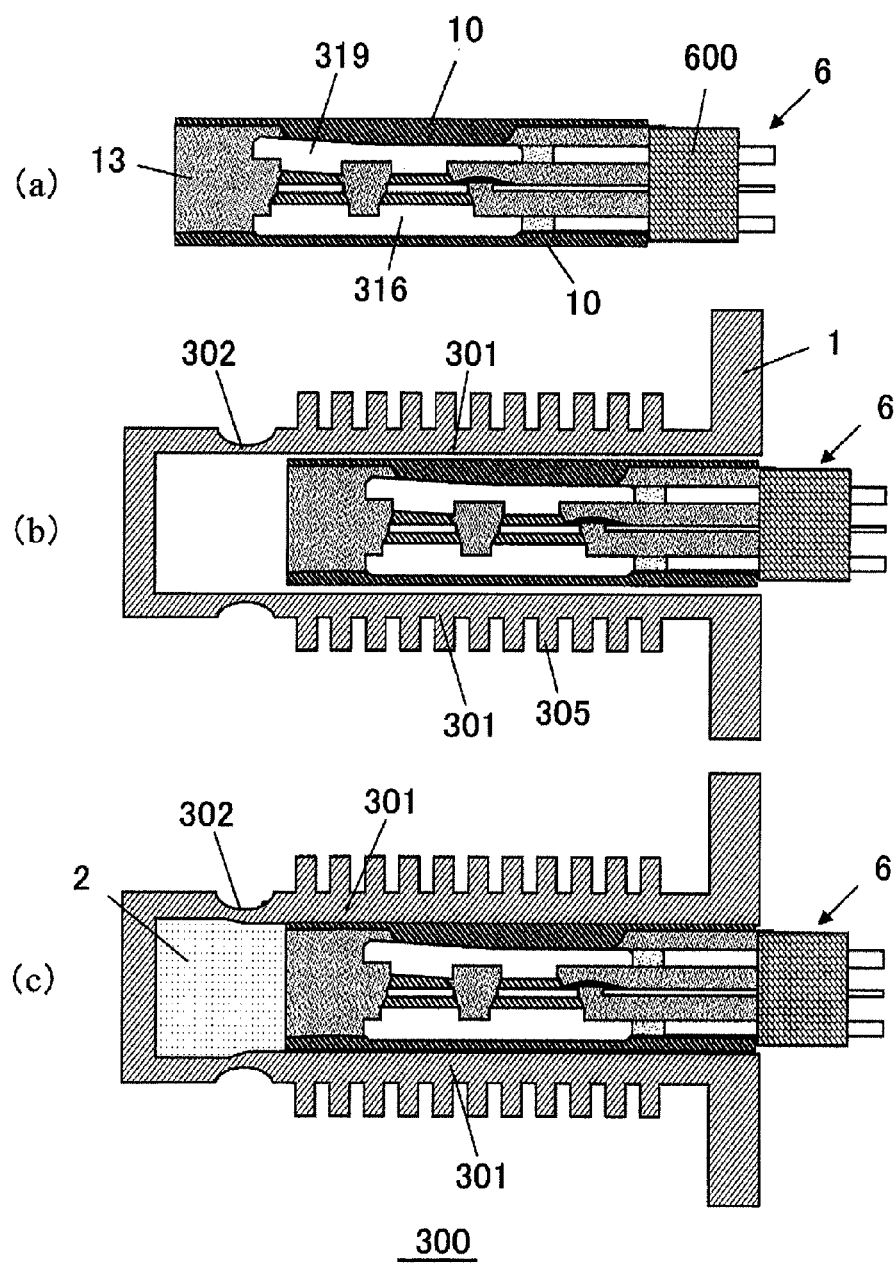
FIG. 21 illustrates a method for manufacturing the power module 300.

FIG. 21 illustrates a method for manufacturing the power module. Initially, the insulation sheets 10 are press-bonded to the front and rear surfaces of the power semiconductor unit 6 formed by transfer molding, i.e., the surfaces of the heat radiation surfaces 316s and 319s of the electrode lead frames 316 and 319 and the surface of the sealing material 13 as illustrated in FIG. 21(a). According to the example shown in FIG. 20, mold release sheets are attached to both the front and rear surfaces of the insulation sheet 10 for increasing working efficiency. During press-bonding, the mold release sheet on one side of the insulation sheet 10 (the side not opposed to the power semiconductor unit 6) is left thereon. In this condition, press-bonding is executed for one minute by using a vacuum pressing machine under a temperature of 130° C., a pressure force of 1 MPa, and an atmospheric pressure of 10 kPa.

The press-bonding of the insulation sheets is performed by two steps: press-bonding in the condition shown in FIG. 21(a); and press-bonding in the condition shown in FIG. 21(c) explained below. The initial press-bonding corresponds to temporary press-bonding work which fixes the insulation sheets 10 to the front and rear surfaces of the power semiconductor unit 6 for facilitating insertion of the power semiconductor unit 6 and the insulation sheets 10 into the metal case 1. In this condition, the resin component contained in the insulation sheets 10 is not completely hardened. More specifically, the resin component is only hardened to a hardening degree of approximately 80% or lower in this condition. For creating this condition, the press-bonding work shown in FIG. 21(*a*) is carried out for 15 minutes or shorter under the condition of a temperature of 140° C. or lower, a pressure of 2 MPa or lower, and an atmospheric pressure of 10 kPa or lower.

After removal of the mold release sheets remaining on the insulation sheets 10, the power semiconductor unit 6 to the front and rear surfaces of which the insulation sheets 10 are press-bonded is inserted into the metal case 1. Then, pressure is applied to the thick portions 301 of the metal case 1 by using a vacuum pressing machine to plastically deform the thin portions 302 for press-bonding between the insulation sheets 10 and the metal case 1. The press-bonding condition in this step was a temperature of 130° C., a pressure of 2 MPa, an atmospheric pressure of 10 kPa, and a press-bonding time of 15 minutes. The second press-bonding work is only required to be performed for 5 minutes or longer under the condition of a temperature of 130° C. or higher, a pressure of 5 MPa or lower, and an atmospheric pressure of 10 kPa or lower. After this bonding work, the resin component of the insulation sheets 10 is hardened to a hardening degree of approximately 90% or higher. As obvious from above, the press-bonding work for bonding the insulation sheets 10 and the inner circumferential surface of the metal case 1 is still required. Thus, complete hardening of the resin component is not allowed in the initial press-bonding work shown in FIG. 21(*a*).

The power semiconductor unit 6 is disposed in the area between the thick portions 301 of the metal case 1. The space surrounded by the thin portions 302 is left as a clearance. In the step shown in FIG. 21(*c*), the potting resin 2 is injected into this clearance area and hardened therein. A power module 300 is now completed by a series of these steps. As illustrated in FIG. 1, each of the thin portions 302 is formed in a U shape to surround the thick portion 301, and the potting resin 2 is injected into this U-shaped clearance space.

Accordingly, the power module 300 including the seamless metal case 1 has substantially watertight structure and thus exhibits excellent water resistance. Moreover, the clearance between the metal case 1 and the power semiconductor unit 6 is sealed by the potting resin 2. Accordingly, the adhesive force of the potting resin 2 strengthens adherence between the power semiconductor unit and the metal case 1, and therefore improves reliability.

—Second Embodiment—

Figure 22:
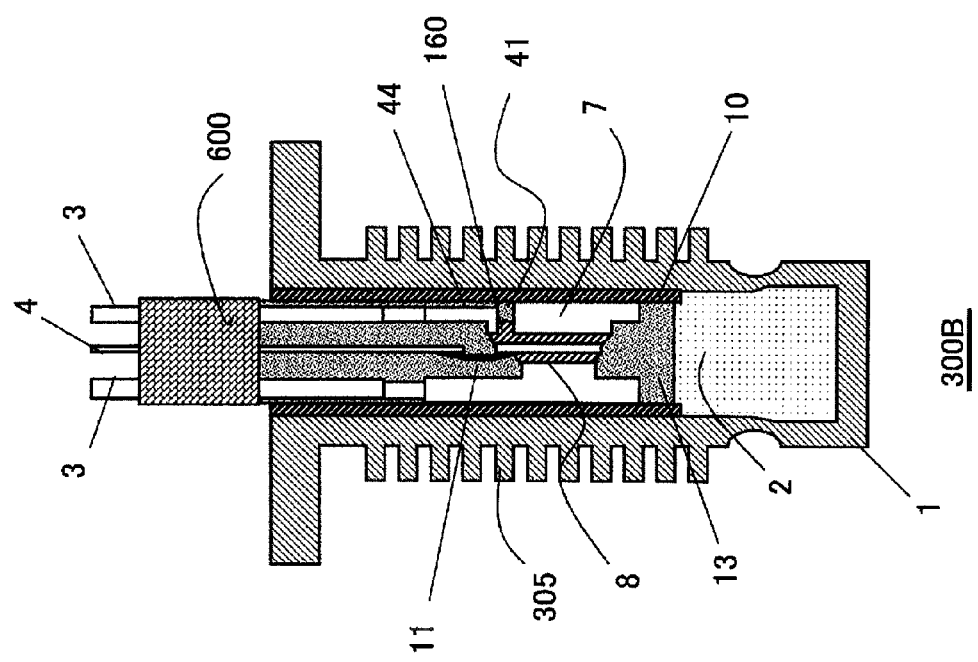
FIG. 22 is a cross-sectional view schematically illustrating the power module 300 according to a second embodiment.

A second embodiment according to the invention is hereinafter described with reference to FIGS. 22 through 25. FIG. 22 schematically illustrates a cross section of a power module 300B according to the second embodiment. The difference between the power module 300B and the power module 300 shown in FIG. 12 is the shape of the electrode lead frame 7. This different point is chiefly discussed in the following explanation.

Similarly to the first embodiment, the power semiconductor unit 6 is housed in the metal case 1, and the insulation sheets 10 are disposed between the power semiconductor unit 6 and the metal case 1. The electrode lead frame 7 has a solder injection hole 41 which penetrates the electrode lead frame 7. In the manufacture of the power semiconductor unit 6, the collector side electrode of the power semiconductor element 5 and the electrode lead frame 7 are joined by solder injected through the injection hole 41. A groove 44 is formed in the heat radiation surface of the electrode lead frame 7 to guide the sealing material 13 toward the solder injection hole 41. Thus, the depth of the groove 44 is set to a length of 100 μm or longer so as to allow the sealing material 13 to pass through the groove 44 and reach the solder injection hole 41 during transfer molding.

Figure 23:
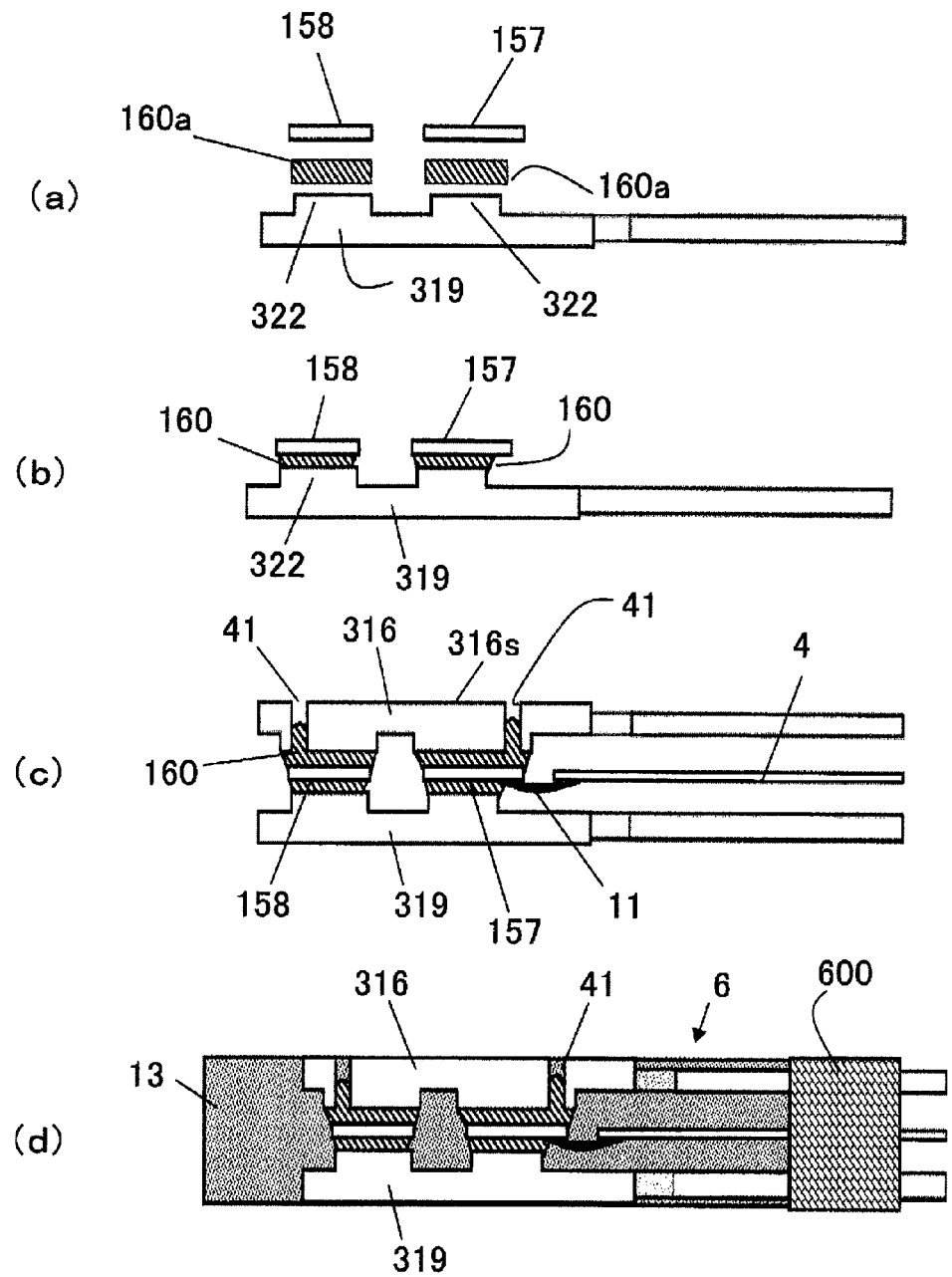
FIG. 23 illustrates steps for manufacturing the power semiconductor unit 6.

FIG. 23 illustrates the steps for manufacturing the power semiconductor unit 6. Similarly to FIG. 14 referred to above, FIG. 23 shows the portions of the IGBT 157, the diode 158, and the electrode lead frames 316 and 319 as an example. The IGBT 157 has the emitter electrode and the gate electrode on the upper side in the figure (chip front surface side), and the collector electrode on the lower side in the figure (chip rear surface side).

Initially, as illustrated in FIG. 23(*a*), the solder sheets 160*a* are placed on the electrode fixing portions 322 of the emitter side electrode lead frame 319, and the IGBT 157 and the diode 158 are placed on the solder sheets 160*a*. In a step shown in FIG. 23(*b*), these components are subjected to collective reflow to fix the IGBT 157, the diode 158, and the electrode lead frame 319 via the solder 160 for electrical connection.

Then, as illustrated in FIG. 23(*c*), the collector side electrode lead frame 316 is held at a predetermined height by using a jig, and melted solder is injected through the solder injection hole 41 formed in the electrode lead frame 316 by dispensing. During injection, the injection amount of the solder is controlled such that the solder does not project toward the heat radiation surface side of the electrode lead from 316, i.e., the solder is recessed lower than the heat radiation surface 316*s* as illustrated in FIG. 23(*c*). Subsequently, the terminal block 600 made of thermoplastic resin and containing the signal terminal 4 formed by insert molding is inserted between the terminals of the collector side and emitter side electrode lead frames 316 and 319, whereafter the gate electrode of the IGBT 157 and the signal terminal 4 are electrically connected via the aluminum wire bonding 11.

Then, transfer molding (not shown) of the sealing material 13 is performed by using metal molds for transfer molding. FIG. 23(*d*) shows the power semiconductor unit 6 formed by transfer molding. The lead frame structure is formed by molding of the sealing material 13, where the heat radiation surfaces 316*s* and 319*s* of the electrode lead frames 316 and 319 are exposed to the front and rear surfaces. The solder within the solder injection hole 41 is recessed from the heat radiation surface 316*s*, and the sealing material 13 is injected into the recess.

Figure 24:
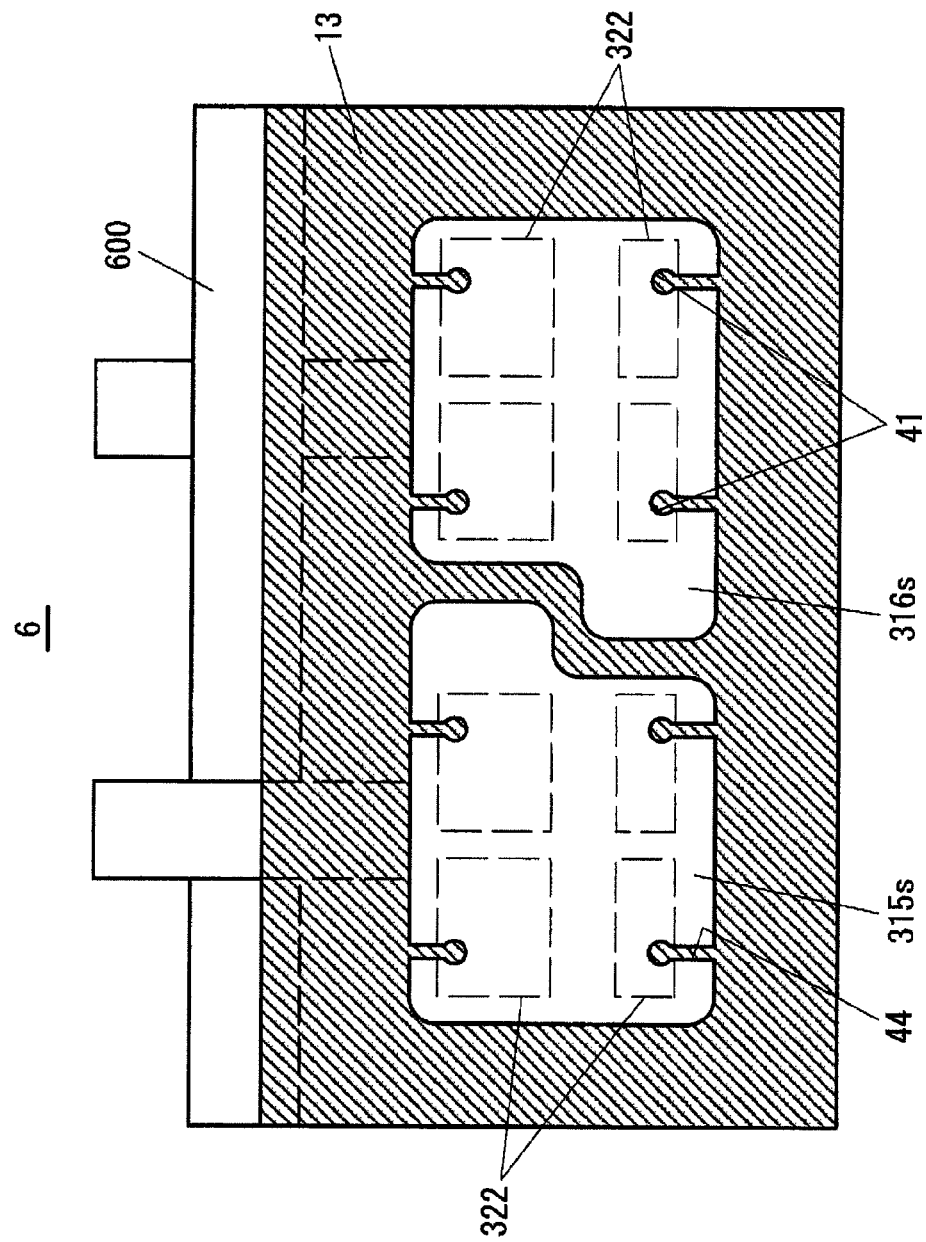
FIG. 24 is a plan view of the power semiconductor unit 6.

FIG. 24 is a plan view of the power semiconductor unit 6. The heat radiation surfaces 315*s* and 316*s* of the electrode lead frames 315 and 316 are exposed through the sealing material 13. The solder injection holes 41 provided for each of the element fixing portions 322 indicated by broken lines penetrate the areas of the electrode lead frames 315 and 316 where the element fixing portions 322 are provided. The grooves 44 extend from the injection holes 41 to the edges of the heat radiation surfaces 315*s* and 316*s*. The sealing material 13 is injected from the edges of the heat radiation surfaces 315*s* and 316*s* through the grooves 44 to the inside of the solder injection holes 41.

According to this embodiment, soldering can be carried out while accurately determining the height of the electrode lead frame 316 by using the jig as noted above. Thus, dimensional variations of the lead frame structure shown in FIG. 23(*c*) in the up-down direction in the figure can be considerably reduced. For reduction of the dimensional variations, it is important that the solder 160 injected into the solder injection holes 41 does not project from the heat radiation surface toward the outside.

According to the examination of the overall height after soldering, it has been found that both prevention of breakage of the power semiconductor element and restriction of the sealing resin within a range of 5 mm from the outer circumference of the electrode lead frame can be achieved when the overall height after soldering is adjusted to a height within a range from 0 to 60 μm from the height of the metal mold cavity.

According to this embodiment, therefore, the clearances between the electrode lead frame 316 and the metal mold and between the electrode lead frame 319 and the metal mold can be decreased to such a length as to prevent entrance of the sealing material 13 toward the heat radiation surfaces 316s and 319s at the time of transfer molding. While the flexible mold release sheet 27 is used for absorbing height variations of the lead frame structure in the example shown in FIG. 14(c), the mold release sheet 27 can be eliminated in this embodiment.

Figure 25:
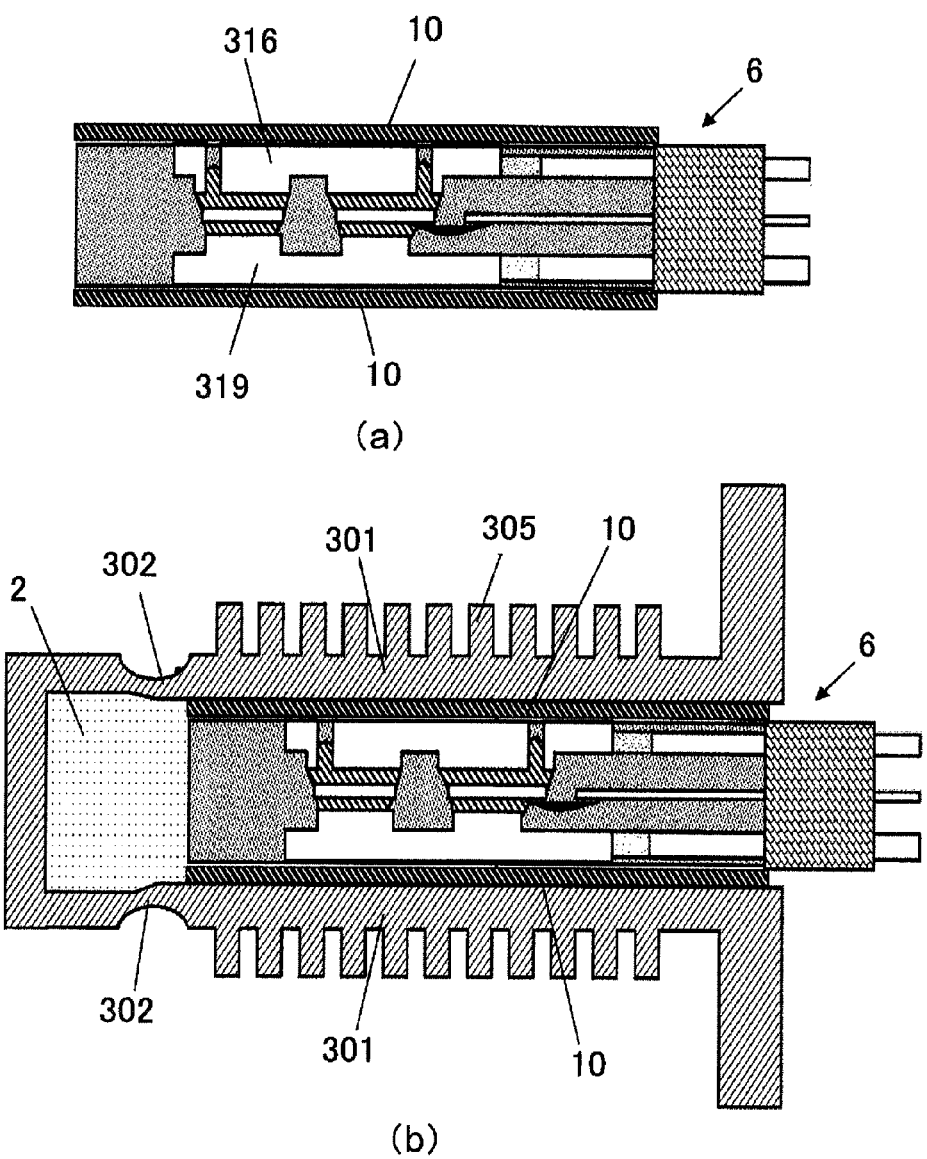
FIG. 25 illustrates steps for manufacturing the power module 300.

FIG. 25 shows steps for manufacturing the power module 300B. In the step shown in FIG. 25(a), the insulation sheets 10 discussed above are press-bonded to the front and rear surfaces of the power semiconductor unit 6 shown in FIG. 23(d). The power semiconductor unit 6 to which the insulation sheets 10 are press-bonded is inserted into the metal case 1. Then, pressure is applied to the thick portions 301 for plastic deformation of the thin portions 302, whereby the inner circumferential surface of the thick portions 301 and the insulation sheets 10 are bonded to each other. The press-bonding steps shown in FIGS. 25(a) and 25(b) are performed in the same conditions as those of the first embodiment. After these steps, the potting resin 2 is injected and heated for hardening, and the power module 300 shown in FIG. 1 is finally completed.

(1) As explained above, the power semiconductor unit according to the embodiments has the electrode lead frames 7 and 8 each constituted by a plate-shaped conductive member as illustrated in FIG. 12. The junction surface to which the electrode surface of the power semiconductor element 5 is metal-bonded is provided on one of the front and rear surfaces of each of the plate-shaped conductive members, while the heat radiation surface is provided on the other surface of each of the front and rear surfaces. The power semiconductor element 5 is formed by molding of the sealing material 13 such that at least apart of the heat radiation surfaces of the electrode lead frames 7 and 8 are exposed. The heat radiation surfaces are brought into thermal contact with the heat radiation members (thick portions 301) via the insulation sheets 10 so as to dissipate the heat of the power semiconductor element toward the radiation members. According to the power semiconductor unit 6 having this structure, the exposed areas of the heat radiation surfaces 7b and 8b and the surface of the sealing material 13 adjacent to the exposed areas form uneven steps from each of which either of the heat radiation surface 7b (8b) or the sealing material 13 projects. The step side surface between the convexed surface and the concaved surface of each uneven step is constituted by the inclined surface 7a or 13a, where obtuse angles are formed by the convexed surface and the inclined surface 7a or 13a and by the concaved surface and the inclined surface 7a or 13a.

Accordingly, the side surfaces of the steps formed by the exposed areas of the heat radiation surfaces 7b and 8b and the surface of the adjoining sealing material 13 have the obtuse-angled inclined surfaces 7a and 13a discussed above. In this case, voids are not included in the steps when the insulation sheets 10 are closely bonded thereto. As a result, the insulation reliability increases even under a use environment of the maximum voltage exceeding 300V. Moreover, the structure which forms the inclined surface 7a at the electrode lead frame end can avoid dielectric breakdown caused by concentration of electric fields.

In addition, even when the plural electrode lead frames 315 and 316 having different potentials are disposed on the same plane as illustrated in FIG. 2, no void is produced on side surface of the electrode lead frame. Thus, tree is not easily produced, wherefore short-circuit resulting from migration is difficult to be caused.

(2) In the case of the uneven step where a part of the heat radiation surface 8b is recessed from the surface 13b of the sealing material 13 as illustrated in FIG. 13(b), the incline surface corresponds to the inclined surface 13a formed at the edge of the sealing material 13 projected in such a manner as to surround the heat radiation surface 8b.

(3) On the other hand, in the case of the uneven step where the entire area of the heat radiation surface 7b is projected from the surface 13b of the sealing material 13 as illustrated in FIG. 13(a), the inclined surface corresponds to the chamfered surface 7a formed at the edge of the heat radiation surface 7b projected from the surface 13b of the sealing material 13.

(4) It is preferable that each angle of the inclined surfaces 7a and 13a lies in the range from 110 degrees to an angle smaller than 180 degrees.

(5) In the case of the power semiconductor element 5 provided with electrodes on both the front and rear surfaces thereof, the power semiconductor element 5 has the first electrode lead frame 7 to which the rear side electrode surface of the power semiconductor element 5 is joined, and the second electrode lead frame 8 to which the front side electrode surface of the power semiconductor element 5 is joined as illustrated in FIG. 12. In this case, the uneven step having the inclined surface is provided at least on either one of the first and second electrode lead frames 7 and 8. This structure allows both surfaces of the power semiconductor element to be cooled, thereby increasing heat radiation.

(6) As illustrated in FIG. 22, the solder injection hole 41 is formed at least either one of the electrode lead frames to provide a through hole penetrating the area from the heat radiation surface to the junction surface. Solder corresponding to metal junction material is injected in a melted condition through the solder injection hole 41 into the clearance between the electrode surface and the junction surface for metal junction between the electrode surface and the junction surface. Moreover, the groove 44 connecting the end of the electrode lead frame and the solder injection hole 41 is formed in the heat radiation surface of the electrode lead frame where the solder injection hole 41 is provided. In this case, the sealing material 13 passes along the groove 44 into the solder injection hole 41 during transfer molding, whereupon the solder injection hole 41 and the groove 44 are covered with the sealing material 13.

According to this structure, solder is injected from the solder injection hole 41 for metal junction between the heat radiation surface and the junction surface. In this case, dimensional variations in the height direction produced during soldering can be reduced by using a jig for soldering. Thus, the clearance length from the transfer metal mold can be decreased to a length sufficient for preventing entrance of the sealing material 13. Moreover, even when the sealing material 13 enters, the inclined surface noted above can prevent void generation in the space facing to the insulation sheet. The solder injection hole 41 is covered by the sealing material 13 introduced through the groove 44. Thus, void generation between the solder injection hole 41 and the insulation sheet can be avoided.

(7) The solder injection hole 41 is formed in such a manner as to penetrate the periphery of the junction surface, and disposed away from the center of the heat radiation surface. This arrangement can reduce deterioration of the heat radiation effect caused by the presence of the solder injection hole 41.

(8) According to the power module in the embodiments, the bottomed metal case 1 has a pair of the opposed thick portions 301 (heat radiation walls) on the outer circumferences of which the heat radiation fins 305 are formed as illustrated in FIG. 12. The power semiconductor unit 6 is inserted into the metal case 1 such that the inner circumferential surface of one of the thick portions 301 is opposed to the heat radiation surface of the electrode lead frame 7, and that the inner circumferential surface of the other thick portion 301 is opposed to the heat radiation surface of the electrode lead frame 8. The heat conductive insulation sheets 10 are disposed in close contact with the heat radiation surface of the electrode lead frame 7 and the thick portion 301, and with the heat radiation surface of the electrode lead frame 8 and the thick portion 301.

This structure allows cooling for both surfaces of the power semiconductor element, thereby increasing the heat radiation effect. Moreover, the structure can prevent generation of voids between the electrode lead frames and the insulation sheets. Furthermore, the structure which covers a part of the heat radiation surfaces by the sealing material can completely prevent direct contact between the electrode lead frames and the metal housing at the time of close bonding between the electrode lead frames and the inner circumferential surfaces of the thick portions of the metal case via the adhesive insulation sheets.

(9) The metal case 1 has the thin portions 302 each of which is provided around the corresponding thick portion 301 and having a smaller thickness than that of the thick portions 301, and allows plastic deformation of the thin portions 302 so that the power semiconductor unit 6 can be held by the thick portions 301. This structure facilitates insertion of the power semiconductor unit 6 into the metal case 1, and securely achieves close contact between the inner circumferential surfaces of the thick portions 301 and the insulation sheets. Accordingly, the heat radiation effect improves. In this case, it is desirable that the metal case 1 is made of metal easy to provide plastic deformation such as aluminum, considering the point that the adhesive insulation sheets 10 are bonded to the heat radiation surfaces of the power semiconductor unit 6 by plastic deformation of the thin portions 302.

(10) Each of the insulation sheets 10 has the highly heat conductive layer 37 containing a volume percentage in the range from 50% to 90% insulation inorganic material having a heat conductivity of 5 W/mK or higher as the heat setting resin, and the closely contacting layers 38 made of heat setting resin and provided on the front and rear surfaces of the highly heat conductive layer 37. The highly heat conductive layer 37 can increase the heat conductivity performance of the insulation sheet 10. The closely contacting layers 38 made of heat setting resin and provided on the front and rear surfaces opposed to the thick portions 301 and the heat radiation surfaces allow the insulation sheet 10 to be bonded to the heat radiation surface and the inner circumferential surface of the metal case 1. Accordingly, adherence between the insulation sheet 10 and the components of the heat radiation surface and the metal case 1 can be maintained even when pressure is not kept applied after setting of the insulation sheet 10.

(11) The closely contacting layers 38 contain a volume percentage exceeding 50% epoxy modified polyamide imide resin as the heat setting resin, and has a structure where silicon resin having an average particle diameter of 5 μm or smaller is micro-phase separated in epoxy modified polyamide imide resin corresponding to matrix resin. This structure increases close contact between the insulation sheets 10 and the components of the hear radiation surfaces and the metal case 1.

(12) When lasers are applied for forming the inclined surfaces on the periphery of the sealing material 13 projecting in such a manner as to surround the circumferences of the heat radiation surfaces, formation of the inclined surfaces can be completed easily within a short period.

(13) According to the method for manufacturing the power semiconductor unit in the embodiments, as shown in FIG. 14, the electrode surface of the power semiconductor element 157 is metal-bonded to the junction surface of the electrode lead frame 316 which has the chamfered surface at the edge of the heat radiation surface. The flexible mold release sheet 27 is disposed between the transfer metal mold 26*b* and the heat radiation surface of the electrode lead frame 316 to which the power semiconductor element 157 is metal-bonded. The transfer metal mold 26*b* is pressed against the heat radiation surface of the electrode lead frame 316 to sink the heat radiation surface into the flexible mold release sheet 27, in which condition transfer molding is performed. According to this method, the heat radiation surface of the electrode lead frame 316 is projected from the surface of the sealing material 13, wherefore the sealing material 13 does not reach the upper side of the heat radiation surface.

(14) According to the method for manufacturing the power module in the embodiments, the insulation sheets 10 are press-bonded to the heat radiation surfaces of the electrode lead frames of the power semiconductor unit under the press-bonding conditions of a temperature of 140° C. or lower, a pressure of 2 MPa or lower, an atmospheric pressure of 10 kPa or lower, and a press-bonding time of 15 minutes or shorter. Then, the inner circumferential surfaces of the thick portions 301 are further press-bonded to the insulation sheets 10 press-bonded to the power semiconductor unit under the press-bonding conditions of a temperature of 130° C. or higher, a pressure of 5 MPa or lower, an atmospheric pressure of 10 kPa or lower, and a press-bonding time of 5 minutes or longer. The initial press-bonding facilitates insertion of the insulation sheets 10 and the semiconductor unit 6 into the metal case 1, while the second press-bonding secures adhesion between the insulation sheets 10 and the thick portions 301.

The teachings of the respective embodiments discussed herein may be used separately or in combination thereof. In either of these cases, the advantages of the respective embodiments can be offered separately or as multiplied advantages. The invention is not limited to the embodiments described herein but may be practiced otherwise as long as the characteristics of the invention can be provided. Other modes performed within the technical spirit of the invention are also included in the scope of the invention.

This application claims priority to the following patent application, the entirety of the disclosure of which is hereby incorporated by reference:

Japanese Patent Application No. 2010-166705 (filed Jul. 26, 2010)

The invention claimed is:
1. A power semiconductor unit, comprising:
a power semiconductor element;
an electrode lead frame formed by a plate-shaped conductive member, one of the front and rear surfaces of the plate-shaped conductive member having a junction surface to which an electrode surface of the power semiconductor element is metal-joined, and the other of the front and rear surfaces of the plate-shaped conductive member having a heat radiation surface; and a mold material which forms the power semiconductor element by molding in such a manner that at least a part of the heat radiation surface is exposed, wherein the heat radiation surface makes thermal contact with a heat radiation member via an insulation sheet to dissipate heat from the power semiconductor element to the heat radiation member, an exposed area of the heat radiation surface and the surface of the mold material adjacent to the exposed area produce an uneven step from which either one of the exposed area and the surface of the mold material adjacent to the exposed area projects, and the step side surface formed between the convex surface and the concave surface of the uneven step has an inclined surface so configured that an obtuse angle can be formed by the inclined surface and the convex surface and by the inclined surface and the concave surface for each.

2. The power semiconductor unit according to claim 1, wherein:

the uneven step is an area where a part of the heat radiation surface is recessed from the surface of the mold material; and the inclined surface has an inclined processed surface formed at the edge of the mold material projecting in such a manner as to surround the heat radiation surface.

3. The power semiconductor unit according to claim 1, wherein:

the uneven step is an area where the whole of the heat radiation surface projects from the surface of the mold material; and the inclined surface has a chamfered surface formed at the edge of the heat radiation surface projecting from the surface of the mold material.

4. The power semiconductor unit according to claim 1, wherein the angle of the inclined surface lies in a range from 110 degrees to an angle smaller than 180 degrees.

5. The power semiconductor unit according to claim 1, wherein:

the power semiconductor element has the electrodes on both the front and rear surfaces of the power semiconductor element;

the electrode lead frame has a first electrode lead frame to which the electrode surface on the rear surface of the power semiconductor element is joined, and a second electrode lead frame to which the electrode surface on the front surface of the power semiconductor element is joined; and an uneven step which has a step side surface forming the inclined surface is provided at least on one of the first and second electrode lead frames.

6. The power semiconductor unit according to claim 5, comprising:

a through hole formed at least in one of the first and second electrode lead frames and penetrating the area from the heat radiation surface to the junction surface;

a metal joining body injected from the through hole into the clearance between the electrode surface and the junction surface in a melted condition, and solidified for metal-connection between the electrode surface and the junction surface; and a groove formed in the heat radiation surface of the electrode lead frame where the through hole is provided, and extended from the end of the electrode lead frame to the through hole, wherein the through hole and the groove are covered with the mold material.

7. The power semiconductor unit according to claim 6, wherein the through hole is so formed as to penetrate the peripheral area of the junction surface.

8. A power module, comprising:

the power semiconductor unit according to claim 5;

a bottomed metal case which has first and second heat radiation walls opposed to each other and having a heat radiation fin on the outer circumferential surface of each of the first and second heat radiation walls, the power semiconductor unit being inserted into the metal case such that the inner circumferential surface of the first heat radiation wall is opposed to the heat radiation surface of the first electrode lead frame, and that the inner circumferential surface of the second heat radiation wall is opposed to the heat radiation surface of the second electrode lead frame;

a first heat conductive insulation sheet disposed in close contact with the inner circumferential surface of the first heat radiation wall and the heat radiation surface of the first electrode lead frame; and a second heat conductive insulation sheet disposed in close contact with the inner circumferential surface of the second heat radiation wall and the heat radiation surface of the second electrode lead frame.

9. The power module according to claim 8, wherein:

the metal case has a first thin portion formed around the first heat radiation wall and having a smaller thickness than the thickness of the first heat radiation wall, and a second thin portion formed around the second heat radiation wall and having a smaller thickness than the thickness of the second heat radiation wall; and the first and second thin portions are plastically deformed in such a manner that the power semiconductor unit can be held by the first and second heat radiation walls.

10. The power module according to claim 8, wherein each of the first and second heat conductive insulation sheets includes a highly heat conductive layer which contains a volume percentage in a range from 50% to 90% insulation inorganic material having a heat conductivity of 5 W/mK or higher in heat setting resin, and closely contacting layers made of the heat setting resin and formed on the front and rear surfaces of the highly heat conductive layer.

11. The power module according to claim 10, wherein the closely contacting layer contains a volume percentage larger than 50% epoxy modified polyamide imide resin as the heat setting resin, and has a structure where silicon resin having an average particle diameter of 5 μm or smaller is micro-phase separated in the epoxy modified polyamide imide resin corresponding to matrix resin.

12. A method for manufacturing a power semiconductor unit which applies lasers to the peripheral area of the mold material projecting in such a manner as to surround the heat radiation surface of the power semiconductor unit according to claim 2 to form the inclined surface.

13. A method for manufacturing a power semiconductor unit, comprising:

a first step which metal-joins the electrode surface of the power semiconductor element to the junction surface of the electrode lead frame provided on the power semiconductor unit according to claim 3;

a second step which disposes a flexible mold release sheet between the heat radiation surface of the electrode lead frame and a transfer metal mold; and a third step which presses the transfer metal mold against the heat radiation surface of the electrode lead frame to execute transfer molding with the heat radiation surface sunk in the flexible mold release sheet.

14. A method for manufacturing a power module, comprising:

a first press-bonding step which press-bonds the first and second heat conductive insulation sheets to the heat radiation surfaces of the first and second electrode lead frames of the power semiconductor unit provided on the power module according to claim 10 under the press-bonding conditions of a temperature of 140° C. or lower, a pressure of 2 MPa or lower, an atmospheric pressure of 10 kPa or lower, and a press-bonding time of 15 minutes or shorter; and a second press-bonding step which press-bonds the respective inner circumferential surfaces of the first and second heat radiation walls to the first and second heat conductive insulation sheets press-bonded to the power semiconductor unit under the press-bonding conditions of a temperature of 130° C. or higher, a pressure of 5 MPa or lower, an atmospheric pressure of 10 kPa or lower, and a press-bonding time of 5 minutes or longer.

\* \* \* \* \*